United States Patent [19]

Knight, Jr. et al.

[11] Patent Number: 5,378,940
[45] Date of Patent: Jan. 3, 1995

[54] CHARGE RECOVERY LOGIC INCLUDING SPLIT LEVEL LOGIC

[75] Inventors: Thomas F. Knight, Jr., Belmont; Saed Younis, Cambridge, both of Mass.

[73] Assignee: Massachusetts Institute of Technology, Cambridge, Mass.

[21] Appl. No.: 102,477

[22] Filed: Aug. 3, 1993

Related U.S. Application Data

[63] Continuation-in-part of Ser. No. 30,625, Mar. 12, 1993, abandoned.

[51] Int. Cl.$^6$ .................................... H03K 19/00
[52] U.S. Cl. .................................... 326/21; 326/121; 326/98; 327/199
[58] Field of Search ................. 307/440, 443, 451–453, 307/296.3

[56] References Cited

FOREIGN PATENT DOCUMENTS

WO a 8911182 11/1989 WIPO .

OTHER PUBLICATIONS

Mead and Conway, *Introduction to VLSI Systems*, Addison-Wesley Publishing Co., Reading, Mass., Oct. 1980, pp. 348–351.

Younis, Saed G. et al., "Practical Implementation of Charge Recovering Asymptotically Zero Power CMOS," Artificial Intelligence Laboratory, Massachusetts Institute of Technology, presented for publication, pp. 1–17.

Fredkin, E., and Toffoli, T., (1978), "Design Principles for Achieving High–performance Submicron Digital Technologies," Proposal to DARPA, MIT Laboratory for Computer Science.

Koller, J. G., and Athas, W. C., "Adiabatic Switching, Low Energy Computing, and the Physics of Storing and Erasing Information," in *Proceedings of Physics of Computation Workshop*, Dallas, Texas, Oct. 1992, pp. 1–5.

Merkle, R. C., "Reversible Electronic Logic Using Switches," Submitted to *Nanotechnology*, 1992, pp. 1–31.

Hall, J. S., "An Electroid Switching Model for Reversible Computer Architectures," in *Proceedings of Physics of Computation Workshop*, Dallas, Texas, Oct. 1992.

Seitz, Charles L. et al., "Hot–Clock nMOS," in *Proceedings of the 1985 Chapel Hill Conference on VLSI*, Computer Science Press, 1985.

Margolis, Norm, Ph.D. Thesis, Physics, Jun. 1987.

*Primary Examiner*—David R. Hudspeth
*Attorney, Agent, or Firm*—Hamilton, Brook, Smith & Reynolds

[57] ABSTRACT

In a pipelined logic circuit, switches are only enabled when voltage differentials across the switches are zero. The switches are configured during a restored state of voltage rails, and a swing in voltage on the rails results in a swing in output voltage to a set level. To restore the logic circuit with minimal energy dissipation and permit useful pipelining, the inputs are regenerated through an inverse logic circuit. The voltage rail then swings back to its restored level. Full forward and reverse pipelines are formed with the individual forward and inverse logic circuits with the pipelines being driven by multiphase clock rails. Each logic stage includes a logic gate and a pass gate.

38 Claims, 14 Drawing Sheets

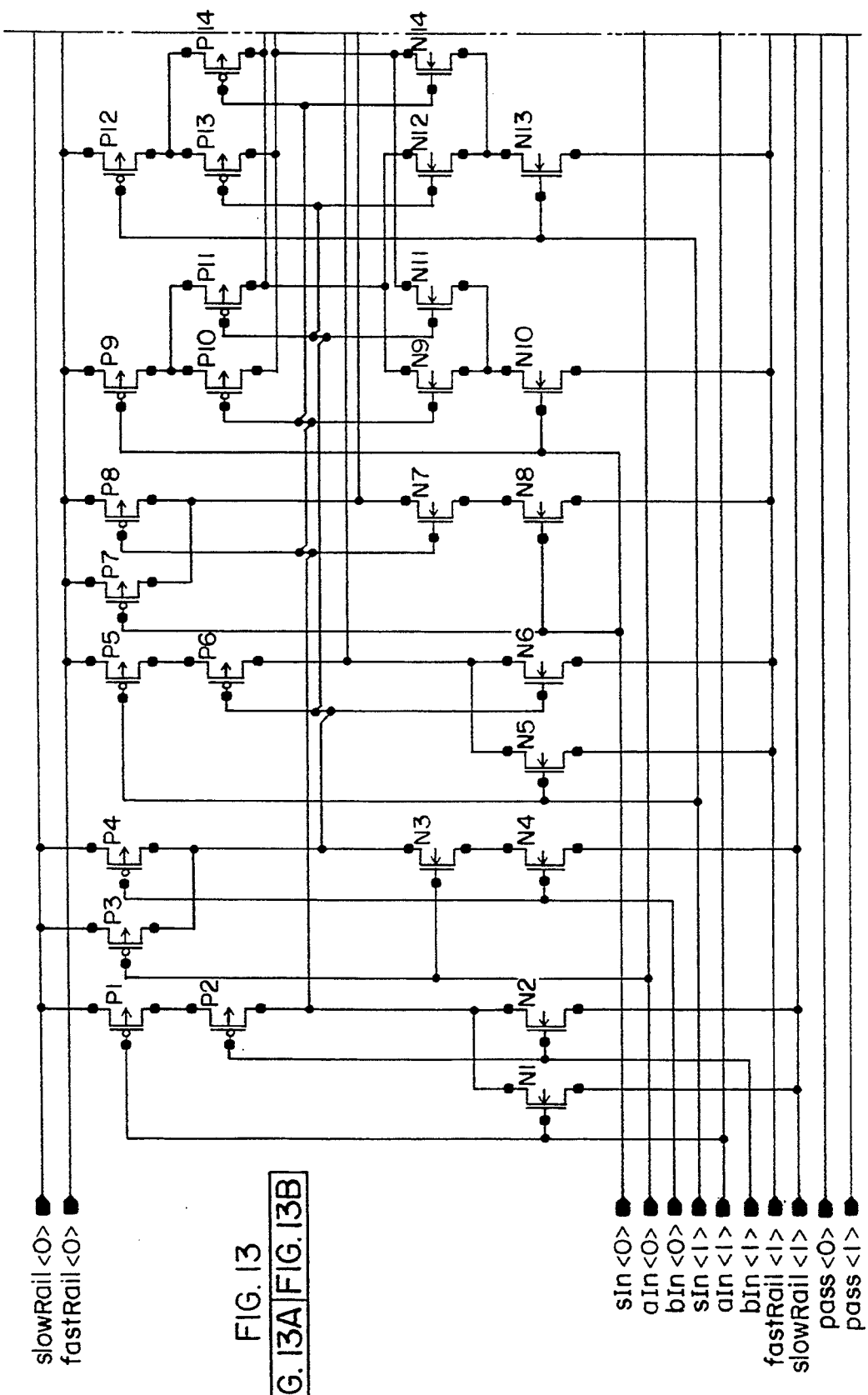

CHARGE RECOVERY LOGIC INCLUDING SPLIT LEVEL LOGIC

GOVERNMENT SUPPORT

This research is supported in part by the Defense Advanced Research Projects Agency under contract N00014-91-J-1698 and the U.S. Government has rights to the invention.

RELATED APPLICATIONS

This application is a continuation-in-part of U.S. Ser. No. 08/030,625, filed Mar. 12, 1993 abandoned.

BACKGROUND

As clock and logic speeds increase, the power requirements of CMOS circuits are rapidly becoming a major concern in the design of personal information systems and large computers. In portable systems, the computational time between battery recharge is limited by a preference for light weight batteries. With large multiprocessor systems, dissipation of the heat from a large volume of processors is a problem. Further, the energy costs become more significant.

In principle, a computing engine need not dissipate any energy, as shown in the work of Landauer, Bennet, and Feynman (Landauer, R., "Uncertainty Principle and Minimal Energy Dissipation in a Computer", *International Journal of Theoretical Physics*, Vol. 21, Nos. 3/4, 1982, pages 283-297; Bennet, C., "The Thermodynamics of Computation—a Review", *International Journal of Theoretical Physics*, Vol. 21, No. 12, 1982, pages 905-940; and Feynman, R., "Quantum Mechanical Computers", *Foundations of Physics*, Vol. 16, No. 6, 1986.) Although these authors approach the problem from different disciplines and use different physical as well as theoretical models, they all conclude that the transfer of energy through a dissipative medium such as a switch dissipates arbitrarily small amounts of energy if this transfer is made sufficiently slowly. This should not come as a surprise: to eliminate the dissipation we have to make the potential applied to the medium zero, and from thermodynamics we know that the only way to transfer energy with zero potential is to allow the transfer to happen over an infinite amount of time.

Power dissipation in conventional CMOS primarily occurs during device switching. One component of this dissipation is due to charging and discharging the gate capacitance through a conducting, but slightly resistive, device. We note here that it is not the charging or the discharging of the gate that is necessarily dissipative, but rather that a small time is allocated to perform these operations. In conventional CMOS, the time constant associated with charging the gate through a similar transistor is RC, where R is the ON resistance of the device and C its input capacitance. However, the cycle time can be, and usually is, orders of magnitude longer than RC. A conclusion is that power consumption can be reduced by spreading the transitions over the whole cycle rather than "squeezing" it all inside one RC. It is this observation that is the core of a number of proposals to construct low power electronic computing engines. By low power, or non-dissipative, we mean that the energy per computational step can be made arbitrarily small by spreading the computation over a longer period.

Fredkin and Toffoli (Fredkin, E. and Toffoli, T., 1978, "Design Principles for Achieving High-performance Submicron Digital Technologies," Proposal to DARPA, MIT Laboratory for Computer Science) demonstrated one realization of a low power universal gate using conservative logic. In conservative logic, the information content as well as the number of 1's and 0's are conserved throughout the computation. One property of a computation using conservative logic is the production of unwanted intermediate outputs. Unfortunately, discarding these outputs results in energy dissipation. Recycling it however, does not. It is this operation of recycling that requires the use of reversible logic (Fredkin, E., and Toffoli, T., "Conservative Logic, "*International Journal of Theoretical Physics*, Vol. 21, Nos. 3/4, pages 219-253). The CMOS gate proposed by Fredkin and Toffoli could not easily be integrated, however, as it requires the use of inductors internal to the computational network. The sizes and numbers of these inductors are well beyond what can be easily accommodated on a silicon substrate.

Aware of the requirement to spread the energy transfer over a longer period of time, Seitz et al. (Seitz, Charles L. et al , "Hot-Clock nMOS," in *Proceedings of the 1985 Chapel Hill Conference on VLSI*, Computer Science Press, 1985.) proposed a new reduced-power CMOS design style. The authors elected to use only N-Channel devices and therefore depended on bootstrapping action in order to eliminate the $V_T$ voltage drop through their devices. The authors having successfully fabricated and operated numerous circuits using this style still warned of the importance of device sizing to achieve enough bootstrapping for proper operation.

SUMMARY OF THE INVENTION

We present a practical implementation of a new logic family, Charge Recovery Logic (CRL), with a power dissipation that falls with the square of the operating frequency, as opposed to the linear drop of conventional CMOS circuits. We show that such power saving is achieved with moderate increases in area and circuit complexity.

To successfully spread the transition over periods longer than RC, one can forbid any device in a circuit from turning ON while a potential difference exists across it. Further, once the device is switched ON, the energy transfer through the device occurs in a controlled and gradual manner. While the latter is relatively easy to control through the use of inductors, the former leads to some interesting restrictions on the way we usually perform computations. One can always determine and control the potential on one side of a CMOS device since it is usually connected to a power supply rail. The potential on the other side, however, depends solely on the result of the computation. To perform a non-dissipative transition of the output, one must know the state of the output prior to and during this output transition. Stated more clearly, to non-dissipatively reset the state of the output one must at all times have a copy of it. The only way out of the circle is to use reversible logic.

The technique of the present invention relies on constructing an explicitly reversible pipelined logic gate, where the information necessary to recover the energy used to compute a value is provided by computing its logical inverse. Information necessary to uncompute the inverse is available from the subsequent inverse logic stage.

In accordance with the present invention, in forward and reverse pipelines of unlatched logic stages, each stage is driven by inputs from a restored state to a set state with swing of clock signals. Each stage of the reverse pipeline performs an inverse function of a parallel stage of the forward pipeline, and interconnections are provided between the forward and reverse pipelines after each stage. The inputs to each forward stage of the forward pipeline are regenerated through a respective inverse stage in the reverse pipeline and are held by the inverse stage as the forward stage is returned to a restored state.

In operation, the outputs of each stage are driven to levels determined by the inputs with a swing of at least one rail voltage. The input to a forward logic stage may be regenerated in the reverse logic stage with swing of the rail voltages of the reverse logic stage which lag those of the forward logic stage. The regenerated inputs which copy the first inputs are then applied to each stage and the outputs are returned to restored levels with swing of the at least one rail voltage to a restored level.

The preferred stage comprises a logic gate and a pass gate, the logic gate being clocked by rails which split from an intermediate voltage to opposite logic level voltages. The outputs of each forward stage are connected in common with outputs of a reverse stage which is the inverse of the next forward stage. The pass gates of the forward stages are turned on before the rails of the forward stages are split, and the pass gates of the reverse stages are turned on after the rails of the reverse stages are split.

In an alternative implementation of the present invention, a multistage logic pipeline comprises a forward pipeline of stages, each performing a respective logic function and a reverse pipeline of stages. Each stage of the reverse pipeline performs a logic function which regenerates inputs of a stage of the forward pipeline from the outputs of that stage of the forward pipeline. Each stage of the pipeline comprises a SET group of switches having outputs determined by SET inputs and by at least one rail voltage. The rail voltage swings between SET and RESET levels during which the switches perform a logic function of the inputs. A RESET group of switches parallels the SET group of switches between the rail voltage and the outputs of the SET group of switches.

In operation, the outputs are driven to SET levels determined by the SET inputs with a swing of the rail voltage to the SET levels. The SET inputs are then disabled to turn off the SET switches, and RESET inputs, which copy the SET inputs, are applied to the RESET group of switches. The outputs are then returned to the RESET levels by the RESET switches with swing of the rail voltage to the RESET level. Outputs of each stage in a forward pipeline are coupled to the SET inputs of the next succeeding stage of the forward pipeline and to the SET inputs of the stage in a reverse pipeline which regenerates the forward input. The outputs of each stage in the reverse pipeline are coupled to RESET inputs of the next succeeding stage of the reverse pipeline and to RESET inputs of the respective stage of the forward pipeline.

With the pipeline driven by four-phase rails, the succeeding stage of each stage of the forward pipeline is driven in phase with the reverse pipeline stage which regenerates the input of the first stage. The pipeline may be of any number of stages which continuously receive data with each cycle of a clock phase.

A preferred rail driver for driving the rail voltage swings comprises an inductor coupled between a voltage source and a clock rail. A switch between the inductor and the clock rail is closed in synchronization with a reference clock. The switch is opened near the voltage peaks of a voltage swing on the clock rail which is caused by closing of the switch. A sensor may be provided for sensing the peak voltage point of the voltage swing. After the switch is opened a limit driver, preferably a current source, drives the voltage of the clock rail to a limit.

The rail driver switch may itself be driven recursively through a like driver circuit to slow switching of the rail driver switch.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 13A–13B is a detailed electrical schematic of module A0 in FIGS. 12A–12C.

DETAILED DESCRIPTION OF THE PREFERRED EMBODIMENT

Figure 1:
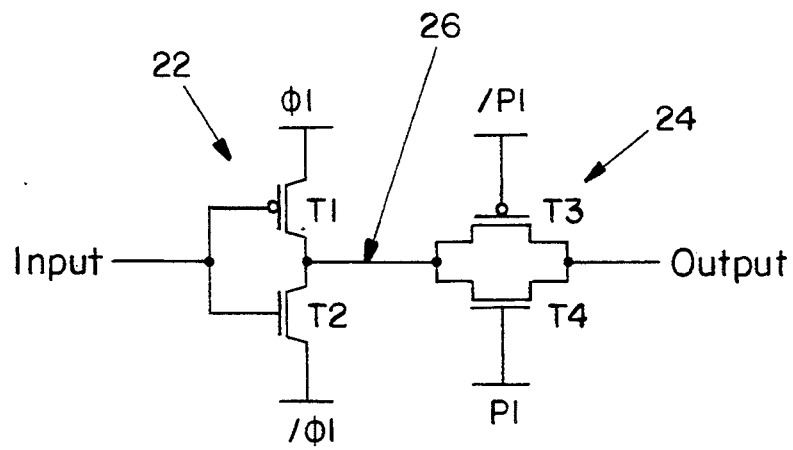
FIG. 1 is an electrical schematic illustration of an inverter circuit used in practicing the present invention.

In prior application U.S. Ser. No. 08/030,625, filed Mar. 12, 1993, and in Younis, S., Knight, R. F., "Practical Implementation of Charge Recovering Asymptotically Zero Power CMOS," *Proceedings of the 1993 Symposium on Integrated Systems*, MIT Press, 1993, pp. 234-250, a new technique was presented for constructing non-dissipative CMOS circuits. Circuits based on that technique were called Charge Recovery Logic (CRL). A new implementation of CRL circuits is presented here. The new implementation is called Split-Level Charge Recovery Logic to distinguish it from the original CRL implementation. While some of the key ideas are common to both the original CRL and Split-Level CRL, the two differ substantially in their implementation of the basic gate.

In both implementations, a multistage logic pipeline comprises a forward pipeline of stages, each performing a respective logic function, and a reverse pipeline of stages. Each stage of the reverse pipeline performs a logic function which regenerates inputs of a stage of the forward pipeline from the outputs of that stage of the forward pipeline. In the prior implementation, each stage of the pipeline comprises a set group of switches having outputs determined by set inputs and by at least one rail voltage. The rail voltage swings to a set level during which the switches perform a logic function of the inputs. A reset group of switches parallels the set group of switches between the rail voltage and the output. The reset group of switches receives regenerated inputs which are copies of the original inputs. With swing of the rail voltage to a restored level, all nodes of the stage are returned to the restored level, the reset inputs assuring that the restoration is non-dissipative. By providing the parallel reset circuit and regenerated inputs, the original inputs may change before the stage is restored; thus an input need not propagate all the way to the end of the pipeline and back before restoration of the stage.

Among the disadvantages of the original CRL were that it required as many as 16 times as many devices as an equivalent conventional CMOS gate and used 4 wires for every signal in the system. It also used the capacitances of nodes to retain a logic level of sampled signals making it sensitive to noise, leakage and undesirable capacitive coupling effects. By using split-level voltages, Split-Level CRL requires only 2 times as many devices as conventional CMOS, uses only one wire to represent each signal in the system and always actively drives outputs during sampling. Like the original CRL, proper sizing of devices in Split-Level CRL increases the power savings factor, and like the original CRL, proper function of Split-Level CRL is not dependent on device-sizing.

In the original CRL, the circuit required at least four swinging rails controlled by four external inductors to achieve the gradual and controlled transition of every signal in the system. Unfortunately, Split-Level CRL requires many more rails. This would limit the practicality of Split-Level CRL if one continued to insist on one inductor for every rail. However, by multiplexing each inductor among a number of rails, as discussed below, the required rails can be controlled with only two inductors.

This specification starts by examining the topology and functionality of a simple Split-Level CRL gate, an inverter. It will then be shown how a general Split-Level CRL gate fits into a computational pipeline. Finally, it will be shown how to generate the swings on the rails using a minimum of one external inductor.

Split-Level CRL Gate

This section describes the topology and operation of a Split-Level CRL inverter. Like conventional CMOS, Split-Level CRL could have many inputs and outputs. The inverter is selected to simplify the description. A device-level diagram of the Split-Level CRL inverter is shown in FIG. 1. It is identical to a conventional inverter except for the addition of a pass gate 24 at the output and in that the top and bottom rails are now driven by clocks rather than $V_{dd}$ and GND.

As can be seen in FIG. 1, the inverter circuit comprises a logic gate 22 followed by pass gate 24. The logic gate comprises complementary transistors T1 and T2. As with a conventional inverter circuit, when the top rail $\phi_1$ is high and the bottom rail $/\phi_1$ is low, the internal output on node 26 is opposite to the input. Thus, a high input drives node 26 low through T2, and a low input drives node 26 high through T1. The pass gate comprises complementary CMOS transistors T3 and T4. A pass gate avoids degradation of the voltage output by a threshold voltage drop across the switch while allowing the final output of the overall gate to be disconnected from the internal output 26 for restoring the internal nodes as discussed below. We call the clock controlling the top rail $\phi_1$ and that controlling the bottom rail $/\phi_1$. We refer to the clocks that control the pass gate as $P_1$ and $/P_1$.

Initially, the input, $\phi_1$, $/\phi_1$, the output, and all internal nodes are at $V_{dd}/2$. In addition, $P_1$ is at GND and $/P_1$ is at $V_{dd}$, so the pass gate is turned off. After accepting a valid input, $V_{dd}$ or GND, we turn the pass gate on by gradually swinging $P_1$ and $/P_1$ to $V_{dd}$ and GND respectively. We now gradually swing $\phi_1$ to $V_{dd}$ and $\phi_1$ to GND. The fact that both $\phi_1$ and $/\phi_1$ start at $V_{dd}/2$ and split towards $V_{dd}$ and GND respectively is the reason we call this family Split-Level CRL. If the input to the gate was at $V_{dd}$, then the output would follow $/\phi_1$ to GND. If the input was at GND, then the output would follow $\phi_1$ to $V_{dd}$. We note that at the end of the $\phi_1$, $/\phi_1$ swings, the output is the NOT of the input. The output is also actively driven and could now be sampled by another gate later in the pipeline.

After the output is sampled by a later gate, the pass gate of this inverter is turned off thus tri-stating the output, that is, the output is free to follow another output. Following that, we return $\phi_1$ and $/\phi_1$ to $V_{dd}/2$. This in effect restores all the nodes except the output to $V_{dd}/2$. We are now ready to accept a new input. Note that allowing the input to change prior to resetting all the nodes to $V_{dd}/2$ could turn some devices on while there is a potential difference across them leading to dissipation. As discussed below, the input is replaced by its copy to avoid changing the state of the logic gate transistors while the rails are at the split levels. The input copies are maintained until the nondissipative swing to the restored voltage levels.

Remember that the output is still at a valid logic level, not $V_{dd}/2$, and before turning on the pass gate we must restore the level of this output to $V_{dd}/2$ to prevent dissipative charge sharing. This task is assigned to a different gate as discussed below.

Reversible Pipeline

The reason for not letting a Split-Level CRL restore its own output to $V_{dd}/2$ is to allow pipelining. Note that to non-dissipatively restore the internal output to $V_{dd}/2$, the input to the gate must be held constant during the splitting and restoration of its rails. If there were only a forward pipeline, the same restriction dictates that this gate does not restore itself before the subsequent gate in the pipeline restores itself and so on. This means that new input to a pipeline would be held constant until the effect of this input propagates all the way to the end of the pipeline and until the restoration of the pipeline starting from the last stage and reaches back to the first gate. This form of retracking pipeline is not very useful.

In this section we show how to connect Split-Level CRL gates, or stages, in a non-dissipative, nonretracking pipeline. The main purpose of this method of interconnection is to provide a way of restoring the level of gate outputs to $V_{dd}/2$ with the right timing.

Figure 2:
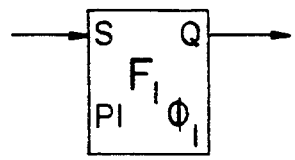
FIG. 2 is an abstraction box used as a basic component of a pipeline circuit embodying the present invention.

We build the pipeline out of copies of an abstraction box shown in FIG. 2. We think of this box as containing a parallel set of Split-Level CRL gates performing any logical function of an arbitrary number of inputs. Symbolically, the output of the box represents a bundle containing the outputs of the Split-Level CRL gates internal to the box. The input to the box represents a bundle containing all the inputs of the gates internal to the box. The function computed by the box is identified by the letter in the center of the box. Finally, indicated at the bottom of the box are the clocks used to control both the split-level rails and the pass gate controls of all the Split-Level CRL gates internal to that box. A clock of $\phi_1$ in the lower right corner indicates that the top rail is connected to $\phi_1$ and the bottom rail to $/\phi_1$, while a clock of $P_1$ in the lower left corner indicates that the pass gate is on when $P_1$ is high.

Figure 3:
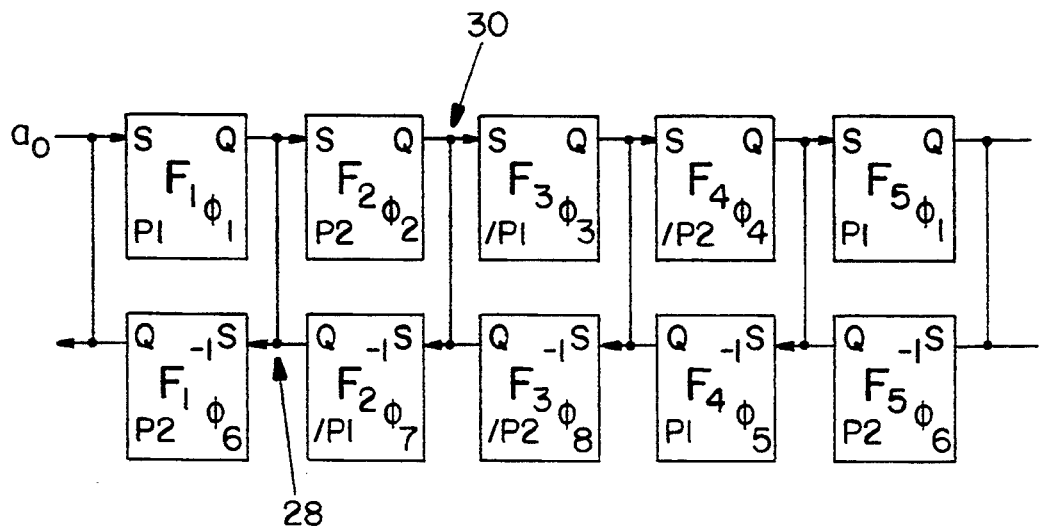
FIG. 3 is a multistage logic pipeline embodying the present invention.

Using this abstraction, FIG. 3 illustrates how Split-Level CRL gates are connected to produce a non-dissipative pipeline. Note that the box with a function $F^{-1}$ performs the inverse operation of the box with a function $F$. The computation proceeds from left to right in the top half of the pipeline and the "uncomputation" proceeds from right to left on the bottom half of the pipeline.

Each line linking Split-Level CRL gates is connected to the outputs of two different Split-Level CRL gates. For example, node (a) is connected to the output of $F_1$ and to the output of $F_2^{-1}$. There are two reasons why no logic fights occur between the gates driving the same line. The first is that when one gate is driving the line the other is tri-stated and vice-versa. The second is that during hand off of control of a line between forward and reverse stages, the voltages at the outputs of the gates are guaranteed to be equal. In this pipeline, the forward gates are responsible for gradually swinging an output line from $V_{dd}/2$ to $V_{dd}$ or GND depending on the computation. The reverse pipeline is responsible for restoring the output line from the active levels to $V_{dd}/2$.

Figure 4:
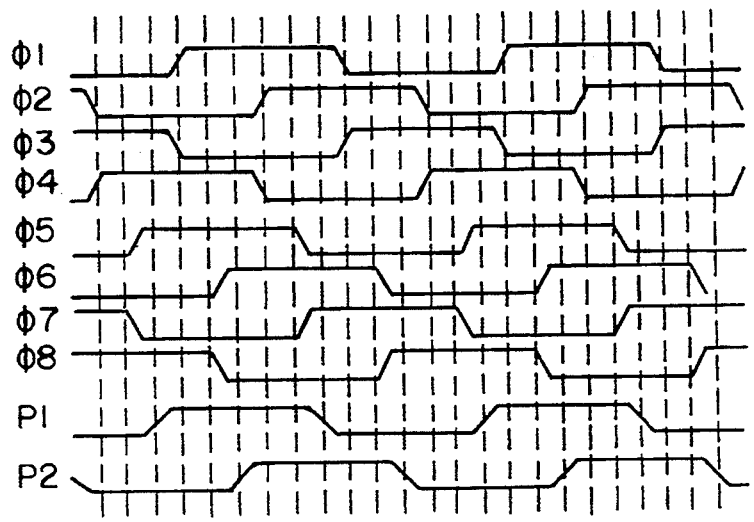
FIG. 4 illustrates the clock signals applied to the pipeline of FIG. 3.

To avoid dissipation, the backward gates have to directly compute the value of the output that they are about to restore to $V_{dd}/2$ and set their output to that level before their pass gate is switched on, i.e., before the line is handed off from the forward gate. To see how this works, we go through the events that occur after a new input, say $a_o$ is presented to the pipeline. First $P_1$ turns on the pass gate of $F_1$ and turns off the pass gate of $F_2^{-1}$. Next $\phi_1$ splits setting node (28) to the value $F_1(a_o)$. $F_2$ goes through similar transitions and produces $F_2(F_1(a_o))$ at node (30). Similarly, $F_2^{-1}$ produces $F_2^{-1}(F_2(F_1(a_o)))=F_1(a_o)$. Note that at his point the voltage levels at the outputs of $F_1$ and $F_2^{-1}$ are at the same level which means that it is now safe to hand off node (28) to $F_2^{-1}$ from $F_1$ by swinging $P_1$ low. After the hand off, we can restore $F_1$ by restoring $\phi_1$. This could occur even without having to wait until $F_2$ is restored because $F_2^{-1}$ is still holding node (28) at its valid value. After $F_2$ is restored $F_2^{-1}$ gradually restores node (28) to $V_{dd}/2$ and hands it over to $F_1$. The timing diagram for a four phase clocking scheme is shown in FIG. 4. For $\phi_1 \ldots \phi_8$ in the figure, a high indicates when they are split and a low when they are restored. For $P_1 \ldots P_2$, a high is $V_{dd}$ and a low is GND. With this pipeline, we are able to accept a new input every cycle of $\phi_1$ without needing to wait for the restoration of later stages.

There remains one problem however. At the end of the pipeline the input to $F_2^{-1}$ is not restored and hence driving this line is dissipative. Furthermore, it could not be generated, as this is the place where reversibility is broken. This implies the fundamental limit that links information entropy with thermodynamic entropy. If at any moment a piece of information that is vital to reconstruct the past is lost, energy is dissipated. Fortunately, this dissipation occurring only at the end of a long pipeline is negligible.

Rail Driver Circuit

Figure 5A:
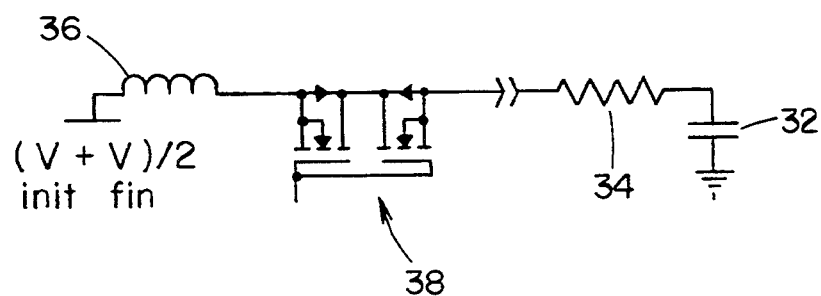
FIG. 5A is a simplified schematic of a rail driver circuit for generating one of clock signals of FIG. 4.

A simplified schematic of a rail driving circuit using a single inductor for every swinging rail is shown in FIG. 5A. A rail can be approximated by a capacitor 32 in series with a resistor 34. The capacitor is the sum of the capacitances that the rail is driving and the resistor is the equivalent resistance of the devices through which the capacitances are driven. The action of connecting and disconnecting the rail is performed by a power MOSFET 38. Suppose that the initial voltage on the rail was $V_{init}$. To start the swing, we connect the rail through an inductor 36 to a DC power supply at $(V_{init} + V_{fin})/2$. Current starts to build up in the inductor and the rail starts the swing towards $V_{fin}$. At the moment that the current drops back to zero again we disconnect the inductor. The rail should now be at $V_{fin}$.

There remains potential dissipation associated with the switch in series with each inductor. This switch is now the only component with significant voltage across it when it is turned on. This is where we expect to see significant power loss. Yet, we are switching the transistor at a time when we can guarantee, as a result of the series inductance, that there is near zero current flow. If we can fully turn on the transistor prior to significant current build up, then dissipation can be minimized.

Turning this switch transistor on requires charging and discharging its gate capacitance. If we do this with a dissipative switching operation, then much of our potential power savings will be thrown away here. However, we can recursively apply the power recovery techniques discussed above to recover the energy stored in the switch transistor gate. Presumably, applying a single level of such recursive power recovery will be adequate for most applications.

Figure 5B:
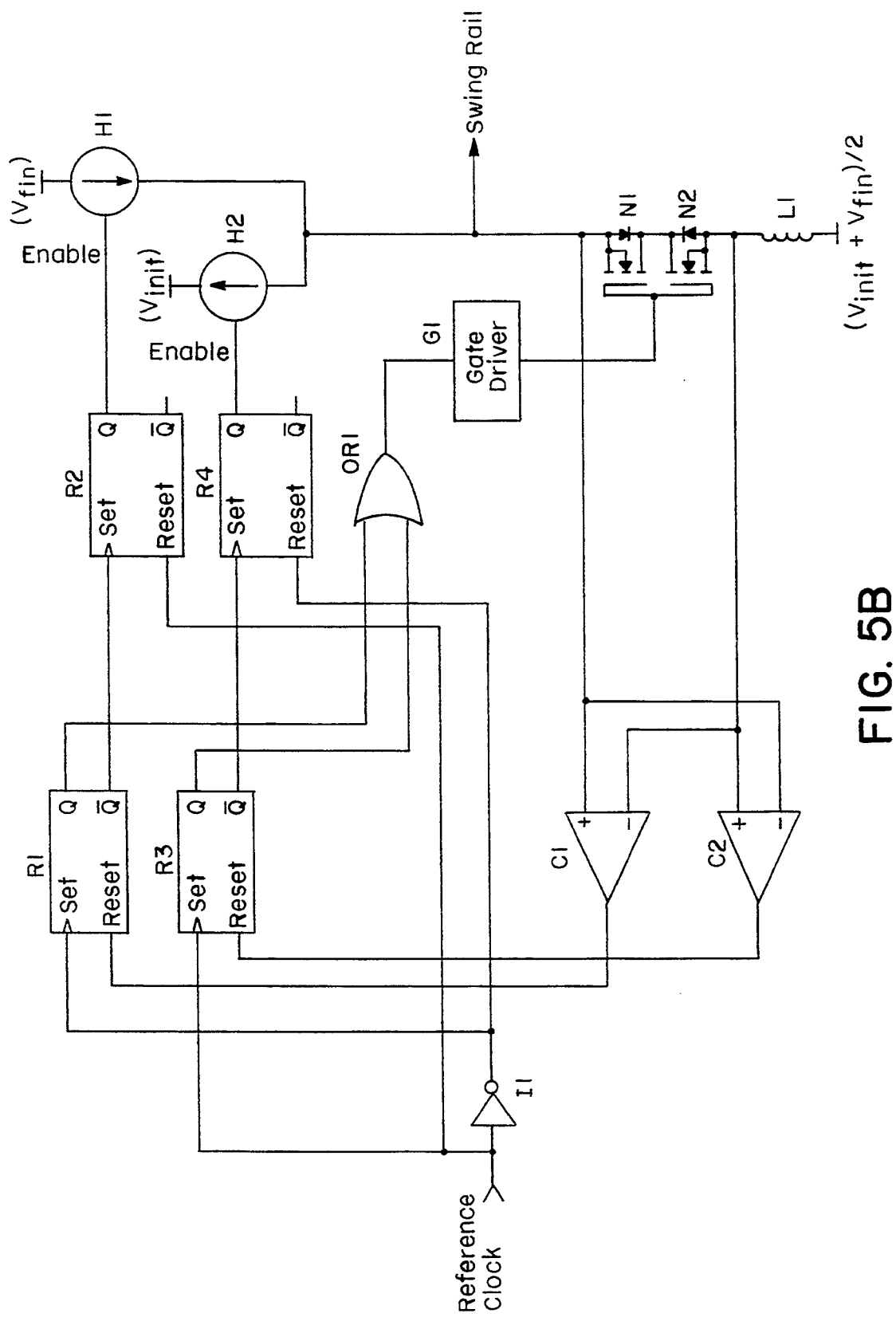
FIG. 5B is a detailed electrical schematic of a rail driver circuit.

FIG. 5B illustrates a circuit that is used to swing a rail. As mentioned earlier, the rail would look like a capacitor from the perspective of this driver. The period of the reference clock determined the period of the rail oscillations. The rise and fall times of the rail are determined by the effective capacitance of the rail and by the inductor L1.

We start with the driven rail initially at $V_{init}$ and to be driven to $V_{fin}$. When the reference clock goes high, the output of the inverter I1 goes high. This triggers R1 and Q goes high. Going through the OR gate, OR1, a high reaches the gate driver G1 and the gate driver generates an output that is enough to turn the Power N-Channel MOSFETs, N1 and N2 on. This effectively connects the rail to the inductor L1 and the rail voltage starts swinging towards $V_{fin}$, the current in the inductor reaches 0 and then starts to increase in the reverse direction. Since even the best MOSFET has some resistance when it is on, the current building up in the reverse direction gives rise to a potential across both N1 and N2. This causes the output of the comparator C1 to go high thus resetting the register R1 which turns off N1 and N2. So as soon as the voltage of the rail reaches the peak, the circuit switches OFF N1 and N2 to stop the swinging. Due to unavoidable dissipation, the rail does not make it all the way to $V_{fin}$. However, when R1 resets, it sets R2, and that turns on the current source H1. The current source dumps charge into the rail until the rail reaches $V_{fin}$. Then the reference clock goes high, R2 is reset so that H1 is disabled.

The reverse swing of the rail to $V_{init}$ is similarly controlled by R3, R4, and C2 and H2.

We use current sources instead of CMOS devices to restore the rail peak voltage to its rest level for one important reason. If we use switches, then the rise time will be determined by the RC time constant of the chip and most of the dissipation will happen in the transistors that do the computation inside the chip. Using current sources, the dissipation will happen in the current sources that are usually off-chip, not to mention that the dissipation will be spread out over a longer time, thus reducing component stresses.

In our circuit, we use two N-Channel power MOSFETs connected in series to connect and disconnect the rail from the inductor at the right time. The reason for using two in series is a practical one. Manufacturers of Power MOSFETs connect the body to one of the terminals thus creating a parasitic diode that is in parallel with the device. Therefore, a discrete power MOSFET when off can prevent the current from flowing only in one direction. In the other direction, the parasitic diode conducts even when the device is off. Putting two MOSFETs in series and pointing them in opposite directions, as shown, allows us to make a switch that prevents current conduction in either direction when off and will conduct current in both directions when on.

To turn the power MOSFETs on and off, we need to charge and discharge their gate capacitors. Since power MOSFETS have a relatively large gate capacitance, this charging and discharging could easily become the dominant dissipation mechanism in a CRL system if done conventionally. We solve this by driving the gates of the power MOSFETs with a CRL rail driver (that is, replace the Gate Driver box, G1, with a Rail Driver Circuit). As we saw, the function of the Rail Driver Circuit is to generate a low-impedance, controlled swing at its output in response to a square wave at the reference clock input with minimum dissipation. If we replace the Gate Driver module, G1, in the Rail Driver Circuit with a copy of the full Rail Driver Circuit then we achieve our goal of providing low impedance drive to the Power MOSFET's gates with minimum power dissipation. We could recursively do the above until the energy saved by one more sub level is offset by the minimum energy that is necessary for operation of the Rail Driver control circuitry. At this point, the innermost level would have a conventional CMOS buffer inside the Gate Driver G1. The dissipation of this conventional buffer would be negligible because of significant current down scaling with every recursive level.

It is important to mention that the rail driver circuit could reside on-chip. The only component that must reside off-chip is the inductor L1. By integrating the Rail Driver Circuit on-chip, we greatly simplify the design of CRL logic. Engineers would assemble CRL ICs just as they do currently with conventional off-shelf CMOS. They simply have to provide a $(V_{init}+V_{fin})/2$ DC supply and an inductor for every rail in the CRL system without having to worry about the details of CRL rail control as it would be hidden inside the CRL chip. In addition, it is possible to build power MOSFETs on-chip that do not have the parasitic diode in parallel with the device and therefore we would need only one Power MOSFET per rail. Also, the efficiency of the proposed rail driver depends highly on the propagation delays of the components. Slow components would shut down the MOSFET a significant time after the swing passes through the peak voltage and therefore would let some charge return to the rail leading to dissipation. On-chip components would have the best response time to minimize this kind of dissipation.

We note that we do not need an inductor per rail per chip. Since rails of different chips could be driven by the same rail driver, we only need an inductor per system rail and not per chip rail.

Conventional power supplies maintain a predetermined voltage at their outputs within a wide range of output currents. They supply a large amount of current if the output voltage drops slightly and they sink a large amount of the current if their output voltage were to be elevated. For maximum power savings, the DC power supply used for $(V_{init}+V_{fin})/2$ has to be a little different. In conventional systems, average as well as instantaneous power always flows from the power supply to the system to compensate for unavoidable dissipation. Instantaneous power in CRL, however, moves back and forth between the power supply and the system. Power flowing into the supply should not be dissipated to maintain the predetermined output voltage. Rather, the energy must be stored even at the cost of allowing the output voltage to increase slightly. To achieve this, a CRL DC power supply should have a very large capacitor at its output just as conventional power supplies. It should differ from conventional supplies in that its control electronics would supply charge to that capacitor to keep the average, and not the instantaneous, output voltage constant. It is significantly easier, and cheaper, to build switching power supplies that maintain constant average output voltage rather than the stricter demand of maintaining constant instantaneous output voltage.

A second difficulty in fabricating circuits with high power recovery is the Q of the inductor. While our derivation assumed an infinite inductor Q, realistic high frequency inductors have Q's limited to the range of 100–200, placing an upper limit on the achieved power recovery.

In some applications, the use of high temperature superconducting high Q inductors, in combination with liquid nitrogen cooled CMOS might be an attractive combination. Achievable Q's with superconducting technology are in the several hundred thousands, and the major limitation might become leakage currents in CMOS devices. These dark currents will also be drastically reduced by low temperature operation. Lowering the temperature also increase the carrier mobility. At liquid nitrogen temperatures, the mobility of carriers in MOS devices increases 4 times under low field conditions and 1.7 times under high filed conditions. Operating under both high and low field conditions, the measured mobility increase in conventional CMOS averages to about 2.5 times. In contrast, CRL operation is by design limited to low field operation and would therefore retain the full benefit of 4 times mobility increase at LNT.

Note that the inductor is only necessary during the transition and is otherwise disconnected from the rail. Note further that the current in a disconnected inductor is zero. With this in mind, we are able to multiplex the inductor among multiple rail circuits so long as these multiplexed rails do not have simultaneous transitions. Examining the timing diagram of FIG. 4, we see that no more than two transitions occur simultaneously at any moment. By using power MOSFET multiplexors on both sides of the inductor, rather than a MOSFET on one side, we see that the number of required external inductors is 2. Since the noted simultaneous transitions do not have to occur simultaneously, the number of inductors can be reduced to one by causing those transitions to occur consecutively. Integrating everything but the inductors on a silicon chip means that a Split-Level CRL chip requires 7 additional pins for proper operations. Two of these pins are $V_{dd}$ and GND.

Pipelines of Other Phases

The pipeline described above required four-phase clocking. This used four different clock phases in the forward pipeline and four others for the reverse pipeline. By four-phase we mean that the shortest feedback path in the pipeline has to span a minimum of four pipeline stages. We will now show how to construct Split-Level CRL circuits using two-phase, three-phase, five-phase and six-phase pipelines. One might simplistically think that less phases lead to less required rails. This unfortunately is not true since for some implementations the required phases are non-symmetric and therefore the complement of a phase cannot be used for more than one purpose. For this reason, the primary reason for reducing the number of phases is to minimize the number of stages for the shortest feedback path. Additionally, the lower the number of phases that a Split-level CRL circuit uses, the easier it is to understand and apply.

Two-Phase Split-Level CRL

Figure 6:
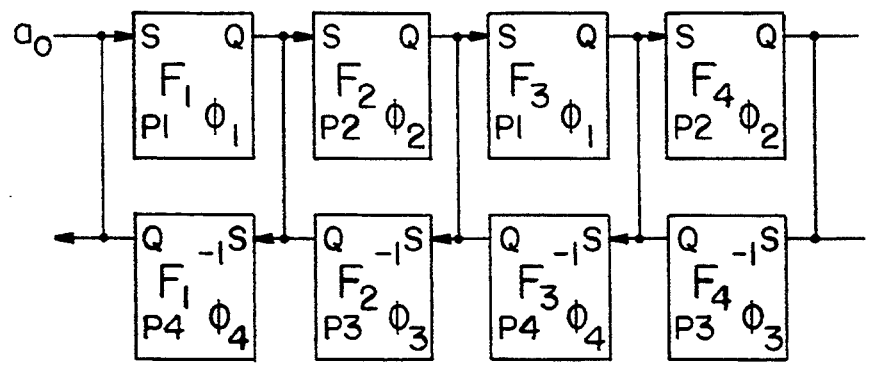
FIG. 6 is an illustration of a two-phase pipeline circuit embodying the present invention.
Figure 7:
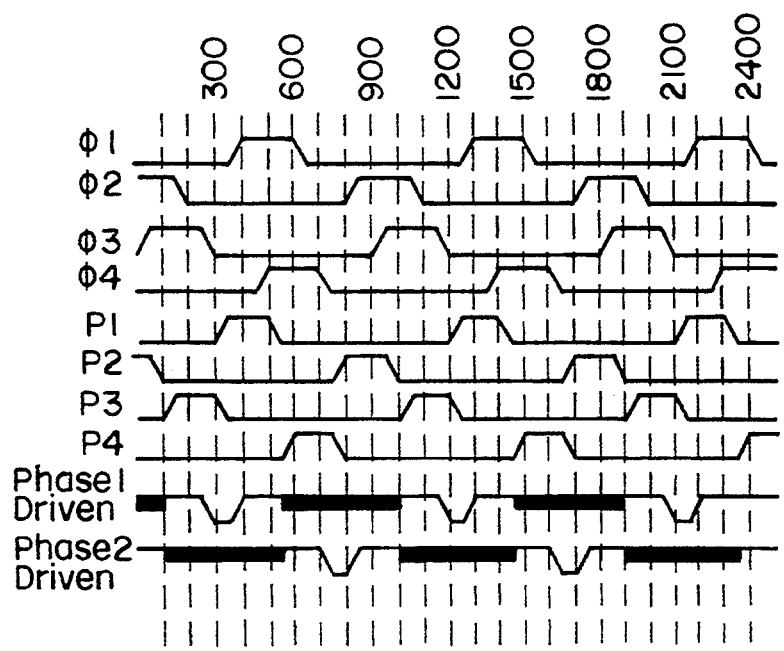
FIG. 7 is illustrates the rail timing for the two-phase pipeline of FIG. 6.

For all phases, the basic gate is the same as the one described in the "Split-Level CRL Gate" section. FIG. 6 shows a pipeline of a two-phase Split-Level CRL implementation. The timing relationships among the rails are shown in FIG. 7. Two-phase Split-Level CRL forfeits the benefit of always actively driving the nodes whenever they are sampled in exchange for achieving two-phase pipelining.

For $\phi_1 \ldots \phi_4$ in the timing diagram, a high indicates the time when $\phi$ and $/\phi$ are split and a low indicates when they are at $V_{dd}/2$. For $P_1 \ldots P_4$, a high indicates that P is at $V_{dd}$ and /P at GND while a low indicates that P is at GND and /P at $V_{dd}$. The bottom two timing lines indicate the states of outputs driven by $\phi_1$ and $\phi_2$ gates. A high there indicates when the output is at an active level of $V_{dd}$ or GND, while a low indicates that the output is at $V_{dd}/2$. The shaded regions in the timing diagrams indicate the times at which the signals are not being actively driven, i.e., floating at an active level.

Three-Phase Split Level CRL

Figure 8:
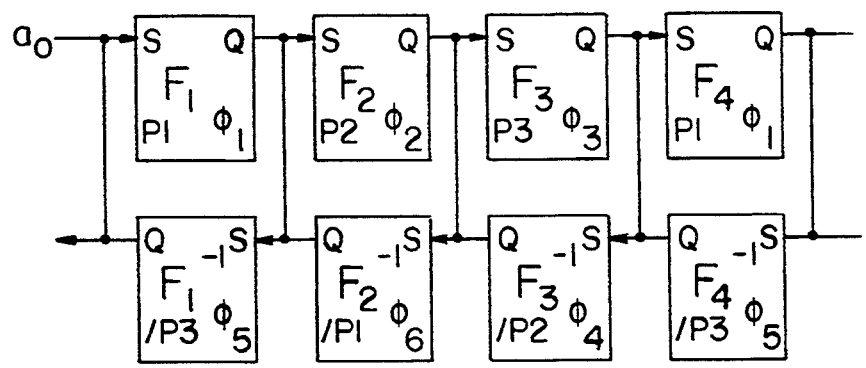
FIG. 8 is a three-phase pipeline embodying the present invention.
Figure 9:
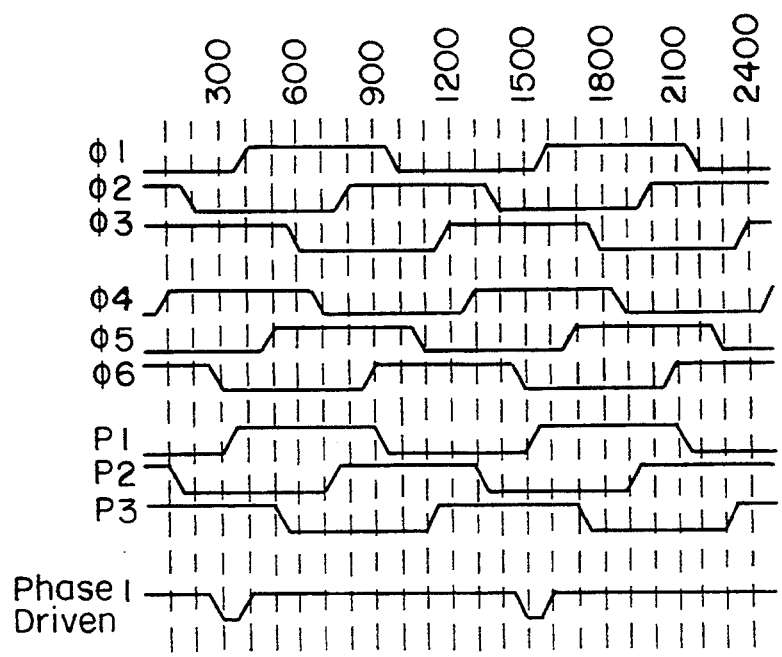
FIG. 9 illustrates the rail timing for the three-phase pipeline of FIG. 8.

FIG. 9 shows the timing diagram of a three-phase Split-Level CRL implementation. The bottom timing line shows the timing of an output that is driven by a $\phi$ gate. Note that in three-phase and higher implementations, the outputs are always actively driven. FIG. 8 shows a three-phase Split-Level CRL pipeline.

It is relatively easy to generalize the above concepts to five-phase, six-phase etc. Since three-phase systems achieve active driven outputs, the usefulness of higher phase systems could be limited.

Non-Inverting Stage

Since the basic Split-Level CRL gate mimics that of conventional CMOS we find that it is not possible to pass a signal through a Split-Level CRL stage without inverting it. For some circuits it is necessary to receive both the true and complement of a logical signal simultaneously at the inputs of a logic gate. Starting with a single signal, it is not possible to have its true and complement arrive at a later stage simultaneously given the circuits we have described so far. In order to pass a signal without inversion we substitute for the basic Split-Level CRL gate the one shown in FIG. 10. Please note that this buffer requires an additional set of controlling clocks we call "Fast $\phi_1$" and "Fast $/\phi_1$" for a $\phi_1$ gate. The restriction on Fast $\phi_1$ is that it splits immediately after $\phi_1$ splits and that it restores just before $\phi_1$ restores. In other words, the transitions of $\phi_1$ contain within them the transitions of Fast $\phi_1$. Thus T5 and T6 in FIG. 10 invert the input and T7 and T8 reinvert the input in the logic gate, and the input signal is then available at the pass gate of transistors T9 and T10. For stages where we want to pass a signal without inversion, we use a gate similar to the one in FIG. 10 and we clock its fast clocks according to the relations described.

Figure 10:
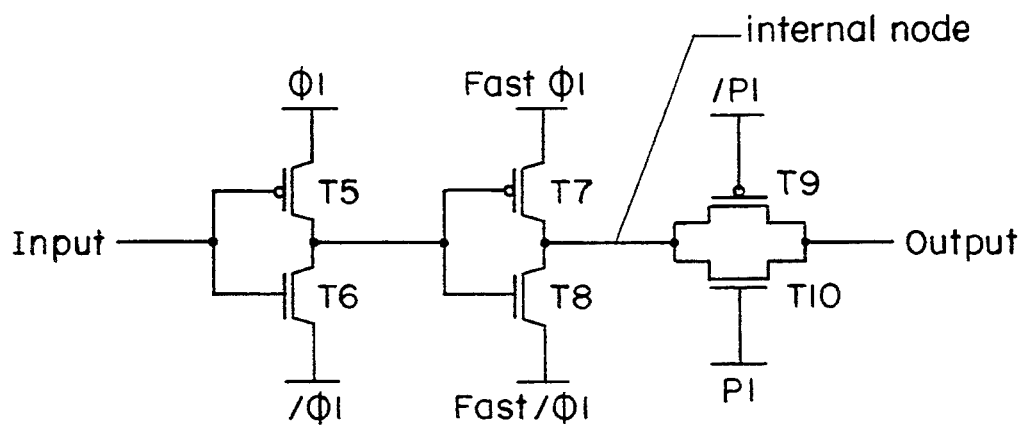
FIG. 10 is a non-inverting Split-Level CRL gate for use with the present invention.

In place of the inverters in FIG. 1 and FIG. 10 one can put any CMOS gate such as NAND, NOR etc. We can see that an additional benefit of a noninverting Split-Level CRL gate, is that it allows each functional block to have a 2-level logic implementation. This generally aids in reducing the storage buffers that are sometimes needed for reversibility.

Another benefit of having 2-level Split-Level CRL has to do with optimal step-up ratio of logic gates. It is well known that a CMOS inverter made out of the minimum size devices can optimally drive between 3-5 other inverters of the same size. A minimum sized inverter driving more than this optimal step-up number of loads similar to is size would have a larger delay. Since the power saving of Split-Level CRL is referenced to the maximum operating frequency of a similar circuit in conventional CMOS, this longer delay leads to less power savings. For an inverter to drive more than 3-5 loads and maintain the same speed, it must be made out of larger sized devices. Unfortunately, larger devices have larger input gate capacitances and hence present a larger load to the gates that are driving them. To see how this could be a problem, let us consider building a multiplier out of an array of identical 1-Bit Split-Level CRL adder gates. The multiplier would consist of an array of gates in which each gate takes its inputs from a previous identical gate and provides on its output the data for the inputs of another identical gate. Typically in these arrangements, each output would fan-out to drive more than 3-5 loads because each input to a gate feeds a number of devices internal to that gate. For Split-Level CRL, just as for CMOS, having an output drive more than 3-5 loads its size is not optimal. As mentioned earlier, increasing the driving capability of a gate so as to be able to drive the loads, i.e., by doubling the width of the devices used in it, also increases the input capacitance, and hence the load, that this gate presents to the identical gate driving it. By attempting to increase the driving capability, we also increased the loads, and thus lost the benefit that we were attempting to gain.

Having 2-level Split-Level CRL allows for increasing the driving capability of a gate without increasing the load it presents to the other gates. This is done by performing most of the computations in the first level and then using the second level to provide the buffering. For this reason the first stage can consist primarily of minimum sized devices, and thus present the minimum load for the previous gate, while the second stage is made of devices 3-5 times the minimum size to give optimal driving capability.

Figure 11:
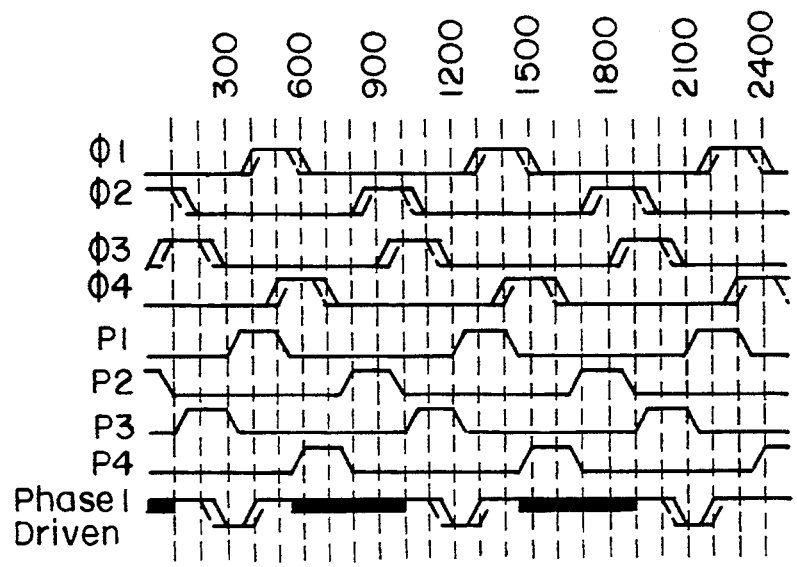
FIG. 11 illustrates the rail timing of a two-phase Split-Level CRL with fast rails for non-inverting stages as illustrated in FIG. 10.

Finally, the timing diagram of a two-phase Split-Level CRL with Fast clocks is shown in FIG. 11. The figure indicates the position of the transitions of the fast rails using the dashed lines.

The Higher Rail Count of SCRL

In all aspects we an see that Split-Level CRL is an improvement over the previous CRL except in one area. Split-Level CRL requires more rails. The number is higher for the following reasons.

First, the reverse pipeline uses a different set of rails than the forward pipeline. This results in doubling the number of required rails in the system.

Second, the top rail of a CRL gate is SET to $V_{dd}$ and RESET to GND while the bottom rail goes in the opposite direction. Since the top and bottom rails swing between the same levels and differ only in direction, the top rail on one stage can be used as the bottom rail for another stage. In Split-Level CRL, the top rail swings between $V_{dd}/2$ and $V_{dd}$ while the bottom swings between $V_{dd}/2$ and GND. The rails differ in both swing directions and levels. Therefore a top rail of a gate cannot be used as a bottom rail anywhere else in the system. This effectively results in again doubling the number of required rails in the system.

Third, the presence of the pass gates, and hence the need for the rails controlling them, in Split-Level CRL. Fortunately, the rails controlling the output pass gates in Split-Level CRL swing between $V_{dd}$ and GND. Therefore a rail driving the NMOS device of the pass gate in a Split-Level CRL stage could sometimes be used to drive the PMOS device of the pass gate in another Split-Level CRL stage. We say sometimes because in order for a pass rail to serve double duty, it must have a 50% duty cycle, that is it has to spend the same amount of time at $V_{dd}$ as it had spent while at GND. This is true for four-phase clocking as seen in FIG. 4. It is also true for three-phase clocking but it is not true for two-phase clocking as we see in FIG. 7. Pass gate rails add another factor of 2 if they are symmetrical and a factor of four if they are not. For the above reasons, a four-phase system requires $(4\times4)+4=20$ rails, a three-phase system requires $(3\times4)+(3)=18$ rails, and a two-phase system requires $(2\times4)+(2)=16$ rails. If we use gates of the form shown in FIG. 10 because of the above stated advantages, then a four-phase system would require 16 additional rails for a total of 36 rails, a three-phase system would require an additional 12 rails for a total of 30 rails and finally a two-phase system would require an additional 8 rails for a total of 24 rails.

Device Sizing in SCRL Gates

In conventional CMOS the devices within a gate are sized to accommodate the worst case delay in the system. This is because the system clock is directly related to the worst case propagation delay in the system. If the propagation delay of a CMOS gate located between two registers is longer than the clock cycle, the circuit will not work. Note, however, that in Split-Level CRL the clock period is always considerably longer than the worst case propagation delay and therefore the circuit will always function correctly. The reason why we are concerned with optimal sizing for Split-Level CRL gates is because the power savings is directly related to the ratio of the maximum possible operating frequency of the circuit to the intentionally much lower frequency at which we will operate the circuit. Therefore, if we wanted to operate at 1 MHz, then building circuits that can potentially run at 100 MHz would save us ten times more power than if we had done a poor job and had built a circuit that could operate up to 10 MHz only.

There is, however, one subtle, but very important difference. Since it is the average, not the instantaneous, power than we are concerned with, sizing of devices in Split-Level CRL gates should be optimized for the average, not the worst, case. For example, it is considered poor design practice to use carry-ripple adders in conventional CMOS circuits. An eight-bit carry-ripple adder consists of eight one-bit adders. There, it is possible that the carry out of the one-bit adder in the least significant position affect the results out of the one-bit adder in the most significant position. To guarantee correct operation in conventional CMOS, the designer has to size his devices, or slow down the system clock, to accommodate the case in which the carry propagates from the least significant bit to the most significant bit, i.e., the worst case. For an eight-bit adder this could correspond to eight gate delays. Statistically however, a carry propagates in an adder 0.6 bit positions on the average and only makes it all the way across about 1/1600th of the time in an eight-bit carry-ripple adder. Therefore a properly sized Split-Level CRL would be optimized for 0.6 carry propagate and would only consume more power whenever the very infrequent worst case occurs. The importance of this cannot be over emphasized. The same could be applied to sizing paralleled NMOS transistors in a NOR gate. Unlike conventional CMOS where the sizes of paralleled devices is not decreased to handle the worst case of only one device being ON, paralleled devices in Split-Level CRL could be made smaller because on the average more than one of the paralleled devices would be on at any given time. This would improve the power savings factor as well as require less device area to implement.

SCRL Circuit Example

Figures 12, 12A, 12B, 12C:
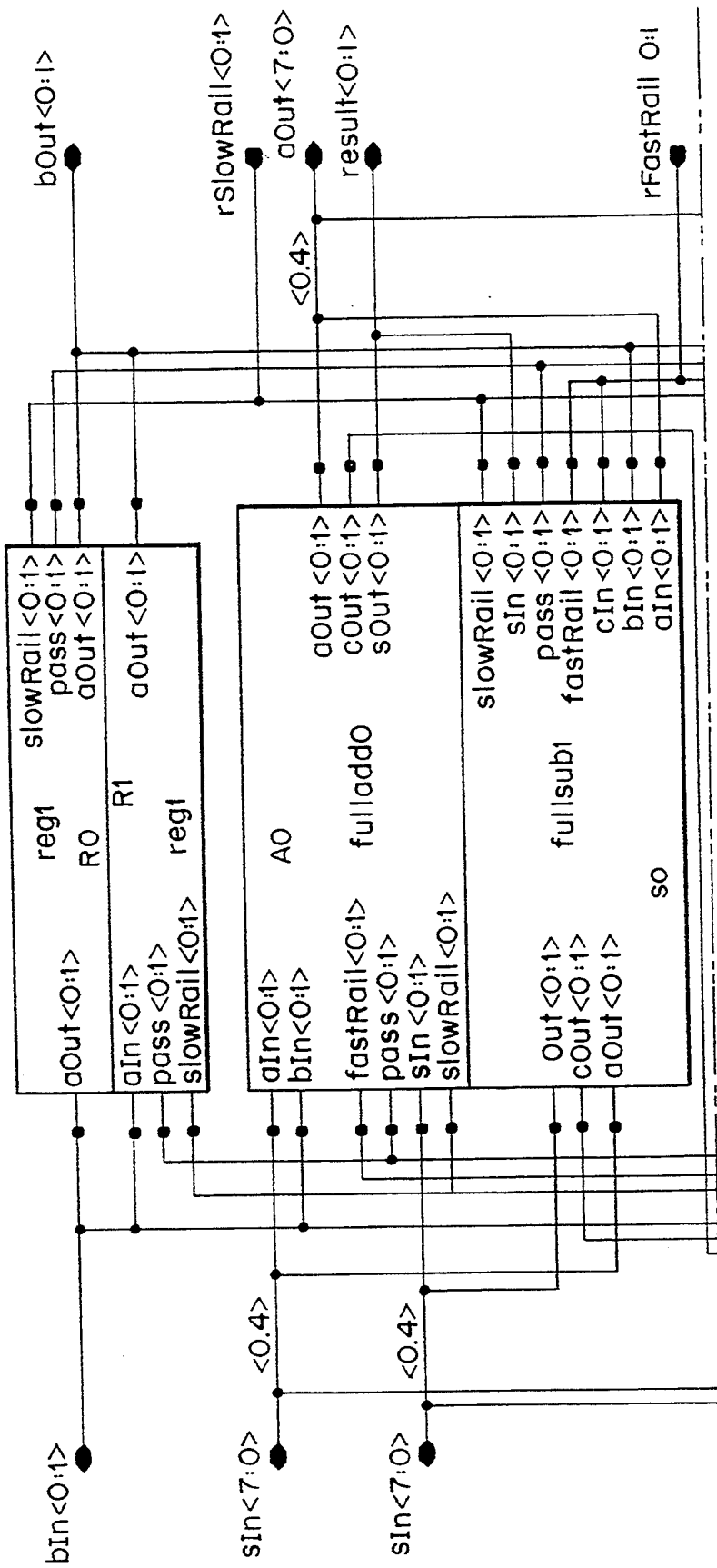
FIGS. 12A–12C is a block diagram of a four-bit multiplying Split-Level CRL adder.
Figure 12B:
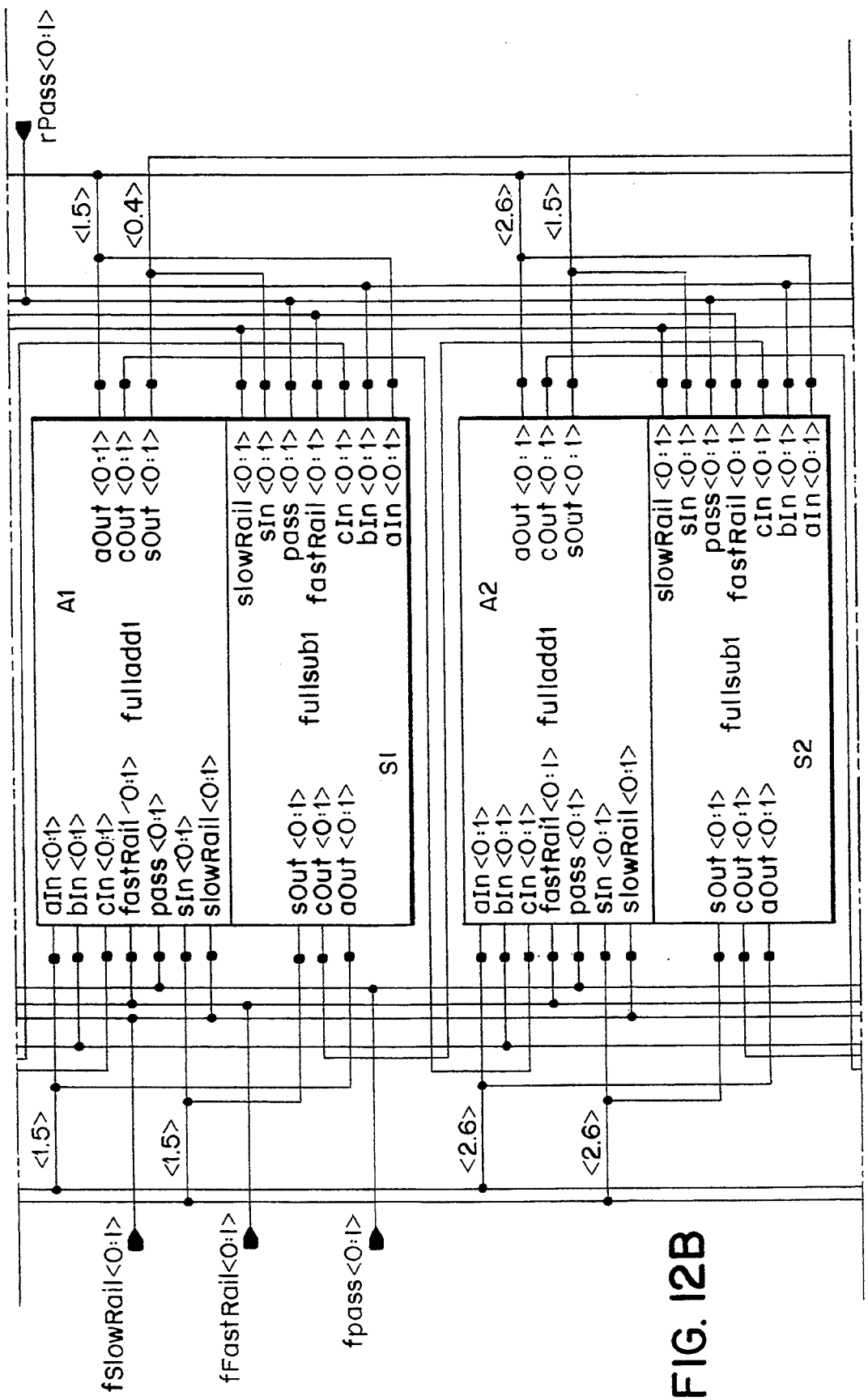
Figure 12C:
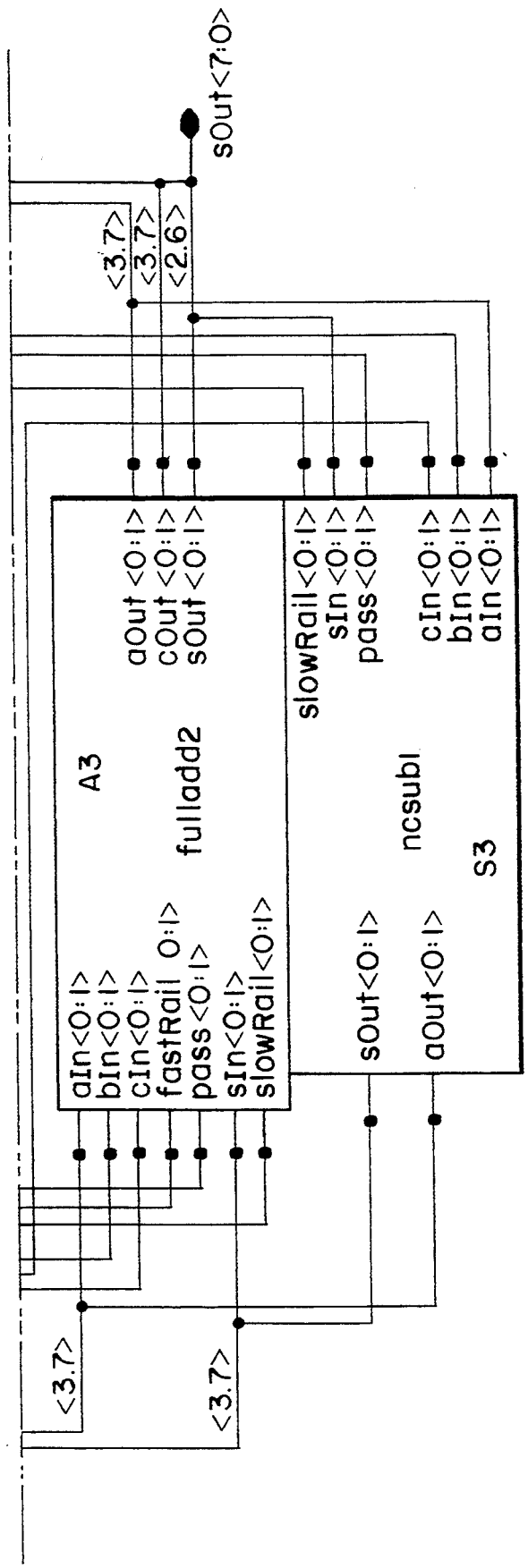

FIGS. 12(A–C)–17 illustrate an example of Split-Level CRL circuit implementation. The block diagram of this single stage adder is shown in FIGS. 12A–C. The circuit is a four-bit adder that one finds inside a four-bit multiplier. It takes aIn [7:0], bIn[1:0] and sIn[7:0] as inputs. The upper four bits of aIn and sIn, aIn[7:4] and sIn[7:4] are the logical complement of the lower four bits, aIn[3:0] and sIn[3:0]. In addition, bIn[1] in bIn[1:0] is the logical complement of bIn[0]. Please note that Split-Level CRL does not require that the logical complement of each input be provided, however in this particular example, providing the complements greatly simplifies the implementation. In the forward direction, the circuit bit-wise ANDs aIn[3:0] with bIn[0] and adds the result of this operation to sIn[3:0]. The result of this addition is a five bit number. The least significant bit is output on result[0] and its complement on result[1] while the four most significant bits of the result of the addition are output on sOut[3:0] and their complement on sOut[7:4]. ANDing aIn with bIn and adding to sIn is one operation out of a sequence of operations that a digital multiplier performs. As is generally known, ANDing an operand with one bit of another and summing to a partial sum is a fundamental sub operation inside any digital multiplier. In addition to the above operation, the circuit also passes through a copy of both aIn[7:0] and bIn[1:0] in the forward direction to aOut[7:0] and bOut[1:0].

In the reverse direction, the circuit takes the five bit result from the addition in the forward direction and subtracts from it the result of ANDing aIn[7:0] and bIn[1:0] that were passed in the forward direction to produce a copy of the sIn[7:0] that were used as input in the forward direction. The circuit also "passes back" a copy of aOut[7:0] and bOut[1:0] in the reverse direction to aIn[7:0] and bIn[1:0].

The modules that operate in the forward direction are labeled A0, A1, A2, A3 and R0. The modules operating in the reverse direction are labeled S0, S1, S2, S3 and R1. In the forward direction, the ANDing of aIn and bIn, the summing of sIn and the passing of aIn through is performed by A0, A1, A2, A3. The passing through of bIn in the forward direction is performed in R0. In the reverse direction, ANDing of aOut and bOut, the subtraction form sOut-result and the passing back of aOut is performed in S0, S1, S2, S3 while the passing back of bOut is done in R1.

All the modules in this example circuit are of the two-level Split-Level CRL type. Each requires a pair of slow and a pair of fast splitting rails in addition to a pair of $V_{dd}$-to-GND swinging rails to control the output pass gates. Modules operating in the forward direction are controlled by fSlowRail[1:0], fFastRail[1:0] and fPass[1:0]. While modules operating in the reverse direction are controlled by rSlowRail[1:0], rFastRail[1:0] and rPass[1:0]. All rails with the subscript 0, fSlowRail[0] for example, are rails with true polarity while rails with the subscript 1, fSlowRail[1] for example, are rails with complement polarity.

Figure 13B:
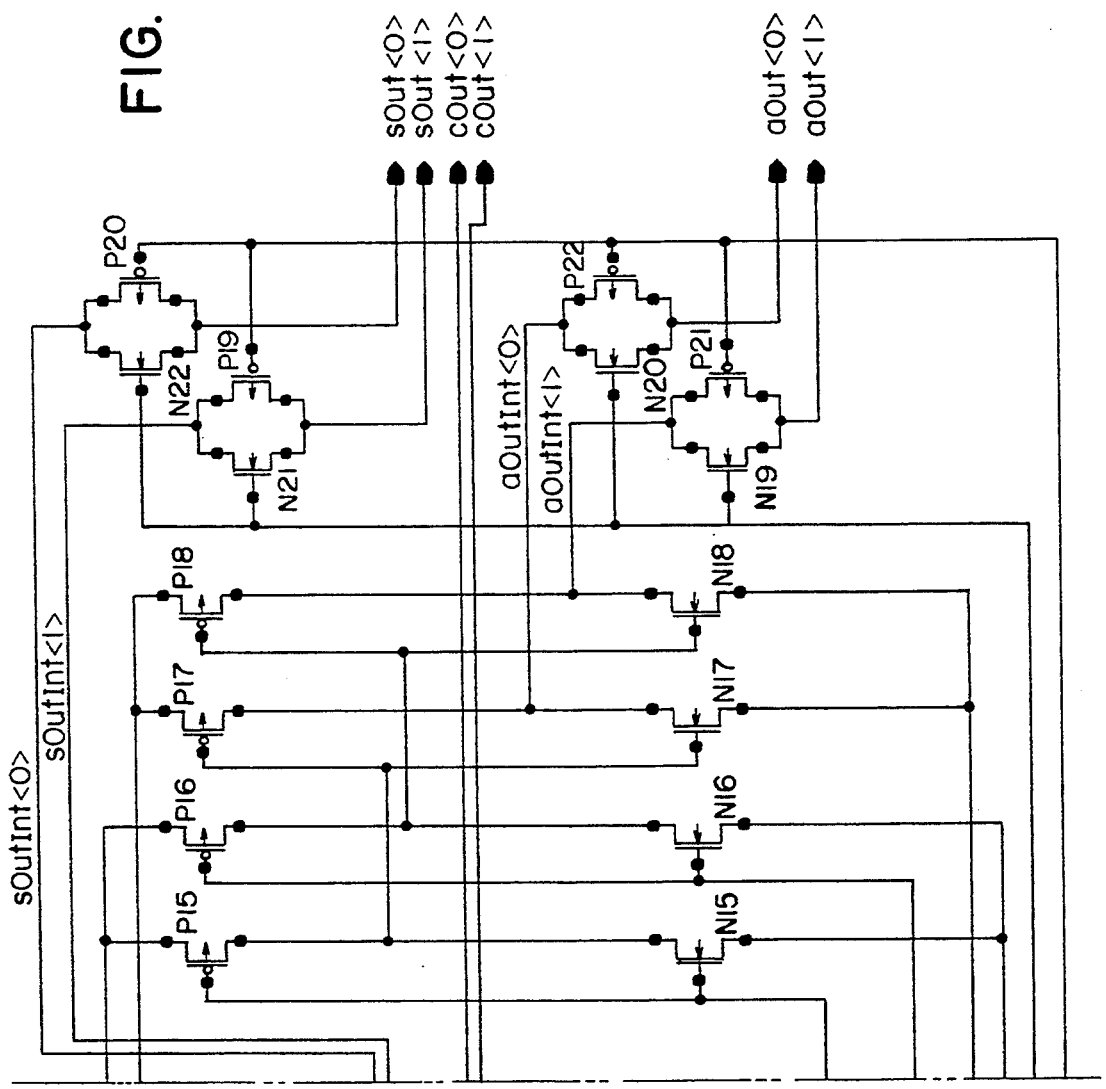

To show how the internals of the modules in the block diagram are constructed, we include in FIGS. 13A–B a transistor level schematic of the module A0 in the block diagram. This module is called fulladd0. The module accepts aIn[0:1], bIn[0:1] and sIn[0:1] and produces as a result the sum bits sOut[0:1], the carry bits cOut[0:1] and passes a copy of aIn[0:1] on aOut[0:1]. The module AND's aIn and bIn and adds the result to sIn. The result of the addition is output on sOut and a cOut. In all of these, signals with a 0 subscript refer to the true value of the signal and those with a 1 subscript refer to the complement value of the signal. cOut[0] is the result of ANDing aIn[0], bIn[0] and sIn[0] while cOut[1] is the logical complement of cOut[0]. This is done in two stages in the illustrated module. In the transistor level diagram, P1, P2, N1 and N2 form a NOR gate that is very similar to that of conventional CMOS. P3, P4, N3 and N4 form a NAND gate. The NOR gate takes aIn[1] and bIn[1] as input to produce what is equivalent to aIn[0] AND bIn[0]. The NAND gate produces the logical NAND of aIn[0] and bIn[0]. P5, P6, N5 and N6 form a NOR gate that takes in the output of the previous NAND gate, P3, . . . , N4, and NOR's it with sIn[1]. The output of this NOR is equivalent to ANDing aIn[0], bIn[0] and sIn[0] and produces cOut[0]. P7, P8, N7 and N8 form a NAND gate that NAND's sIn[0] with the result from the NOR gate consisting of P1, . . . , N2, to produce cOut[1]. P9, . . . , P14 and N9, . . . , N14 form an XOR and an XNOR gates to produce sOut[0] and sOut[1] respectively. Before reaching the output pins, sOut[0:1] goes through two pass gates consisting of P19, P20 and N21, N22. These pass gates are the one that are unique to Split-Level CRL and differentiate this circuit from conventional CMOS. P15, . . . , P18 and N15, . . . , N18 are cascaded inverters that pass through aIn[0:1] to aOut[0:1]. The output of these inverters goes through the necessary pass gates, P21, P22 and N19, N20, before reaching aOut[0:1]. The cOut[0:1] outputs do not go through pass gates so that we can build a multi-bit wide carry-ripple adder by stringing a number of one-bit adders similar to the module just described with all the one-bit adders controlled by the same rails, i.e., on the level. Lowering the Cost of Irreversibility In CRL and Split-Level CRL the reverse pipeline is required to accurately provide a delayed copy of the inputs that were used in the forward pipeline. Without the reverse pipeline we do not have enough information to always correctly compute the delayed copy of the inputs that are required to non-dissipatively reset the stages in the forward pipeline. The penalty of erroneously computing a delayed copy of these inputs is to dissipate power similar to conventional CMOS for every erroneous bit. Unfortunately, there are situations in which providing the inverse of a function in the forward pipeline is not feasible or at least cumbersome. Luckily all is not lost since in most of these cases we could apply a number of techniques that would make the dissipation associated with this Irreversibility minimal.

The first relies on the observation that we are mainly concerned in reducing the average, not the instantaneous, power consumption. Gates that computed the inverse function of the gates in the forward direction produced a correct copy of the inputs all the time. Without these inverse gates, we cannot guarantee to be correct all the time. In certain applications however, we can guarantee to be correct most of the time. Since dissipative events only occur whenever we guess wrong, being correct most of the time results in substantial power savings when compared to conventional CMOS without the need for reversibility. To illustrate this we consider an example of an eight-input NAND gate. This gate outputs a FALSE if and only if all the inputs were TRUE. Otherwise, this gate outputs a TRUE. Assuming that the input bits are random, the probability of the output of this gate being at TRUE is 255/256=0.996. If we always assume the output to be at TRUE, then we will have a dissipative event, caused by a wrong prediction, only 0.3% of the time. In the pipeline in FIG. 3 let the $F_1$ be this eight-input NAND gate. Then we can omit $F_2^{-1}$, assume that this omitted inverse gate output a FALSE all the time, and be right 99.6% of the time. This could be important in situations in which the computation of $F_2^{-1}$ is not feasible or otherwise cumbersome.

Figure 14:
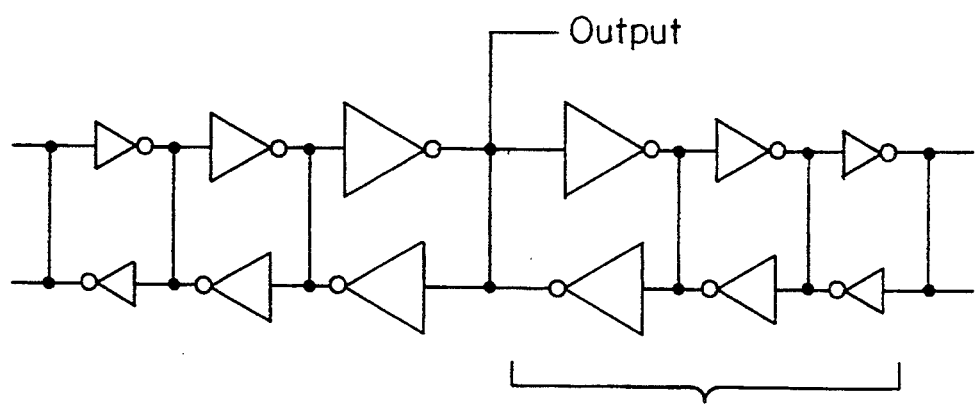
FIG. 14 illustrates a method of reducing cost of irreversibility of a circuit.

The second technique concerns the way multi-stage buffering is done in CMOS and in Split-Level CRL. To drive a large load in CMOS, one must go through a number of progressively larger devices with each device driving another that is slightly larger than itself until the last one in the chain is large enough to drive the load. In Split-Level CRL, each larger stage would be paralleled by another stage of comparable size in the reverse direction, If reversibility were broken immediately after the largest stage then dissipation would be large owing to the fact that the input capacitance of the large reverse gate is significant. To alleviate the problem, we must proceed with the pipeline beyond the last stage with inverters in the forward and reverse direction scaling down the size at each successive stage until we reach the minimum size possible. If reversibility is broken immediately after this minimum size stage, dissipation would be minimized due to the much smaller input capacitances of the reverse stage. This is shown in FIG. 14.

Otherwise irreversible stages of the pipeline may be made reversible by including pass logic circuits for passing the input to the output. The reverse stage then becomes a simple pass circuit for returning that input as a copy. For processing a function, such as addition, of multibit inputs, forward and reverse pass logic circuits are provided in successive stages of the forward and reverse pipelines. The pass logic circuits delay and regenerate the multiple bit inputs to the pipeline in forward and reverse subpipelines. Partial logic function circuits, such as partial adders, in successive forward stages receive input copies from pass logic circuits in the reverse pipeline. Partial inverse logic function circuits, such as subtractors, in the reverse pipeline regenerate the multiple bits of the input in successive stages to terminate the reverse pipelines.

Figure 15:
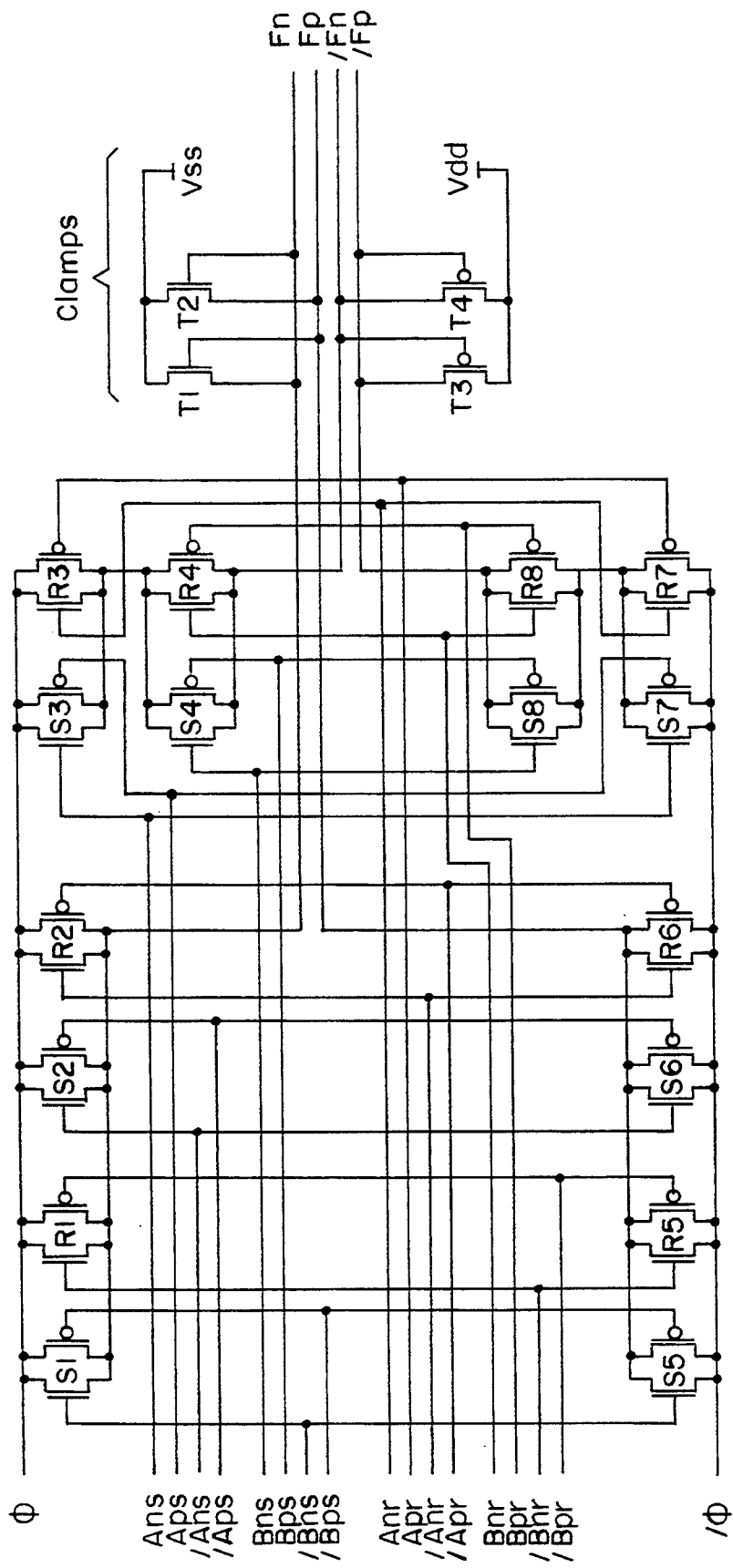
FIG. 15 illustrates an alternative implementation of the invention using a SET circuit with a parallel RESET circuit.
Figure 16:
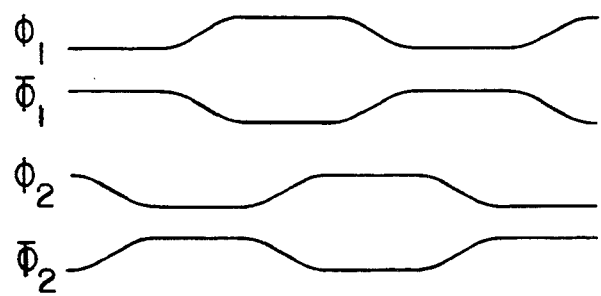
FIG. 16 illustrates the four-phase clock rails used to drive a pipeline using the circuit of FIG. 15.
Figure 17:
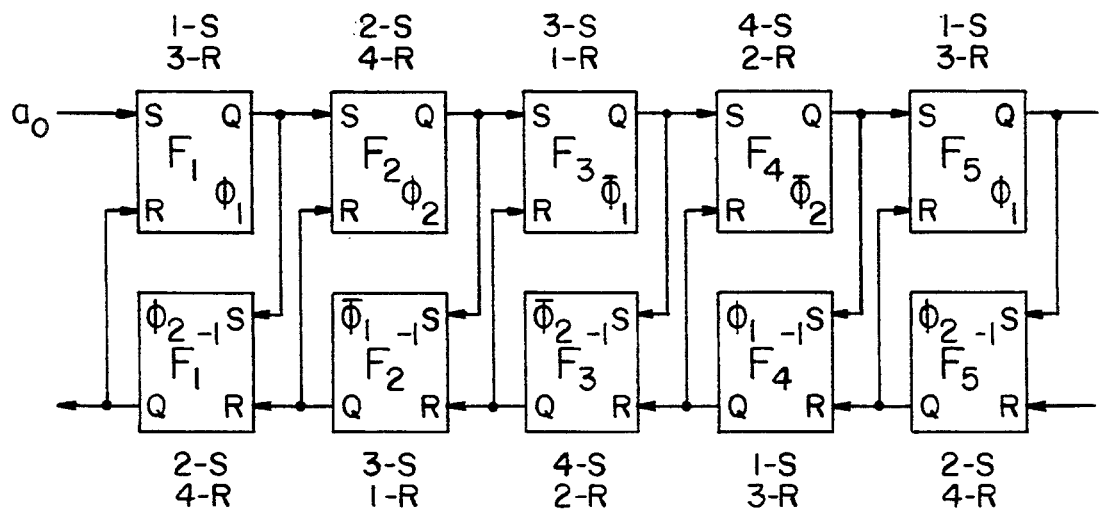
FIG. 17 illustrates a pipeline embodying the present invention using the circuit of FIG. 15.

FIGS. 15, 16 and 17 illustrate an alternative embodiment of the invention previously presented in prior application Ser. No. 08/030,625. In this embodiment, a lessor number of clock signals is required since the regenerated inputs are held at each forward stage by RESET switches in the forward stage rather than at the output of the inverse stage. The circuit of FIG. 15 and operation of the circuit in the pipeline of FIG. 17 is as follows.

Because we use pass gates instead of single transistors, we generate and distribute the electrical complement of each of our data lines in order to control the P-Channel side of the pass gates. We identify the lines intended to drive the N-Channel devices by the letter "n" in the subscript, and those for the P-Channel devices by the letter "p". Furthermore, for universality this CRL circuit generates and distributes the logical complements of the data lines. We identify those in the figure by the forward slash character, /.

From the above we see that this circuit sees four wires to represent each data line. An active data line A, representing the logic value 1, has $A_n=1$, $A_p=0$, $/A_n=0$, $/A_p=1$ for example. The apparent redundancy is required because the reset states of $A_n$ and $/A_n$, for example, are the same rather than logical complements. The CRL gates have two stable states, the SET state and the RESET state. While in the SET state, the output lines of a CRL gate are valid and can be sampled by a subsequent gate. While in the RESET state, the output lines of a CRL gate must be forced to levels that will turn off any pass gates they are driving. Note that while electrically complementary lines are always at opposite levels, logically complementary lines are at opposite levels only when the gate driving them is in the SET state, thus the distinction between the two and the need for four wire signalling.

Each CRL gate accepts two input groups. The first is the SET group, and we identify the lines belonging to this group by the letter "s" in the subscript. The second is the RESET group, and for it we use the letter "r" in the subscript. In going from the RESET state to the SET state, the gate sets the SET inputs to compute its valid output. At that time the gate assumes, and we require, that all the RESET inputs are idle. We define an idle input as one that is at a level that will turn off any pass gate it controls. In going from the SET state to the RESET state, The gate uses the RESET inputs to non-dissipatively restore itself to the RESET state.

In FIG. 5, we have 16 pass gates labelled S1 through S8 and R1 through R8. The S gates are associated with the SET inputs, and the R gates are associated with the RESET inputs. Note that every SET pass gate is paralleled by a corresponding RESET pass gate. For full restoration to the RESET state, it is important that the SET and RESET pass gates be paralleled in the same order and with connections between intermediate pass gates in a series chain. For example, the node between S3 and S4 is connected to the node between R3 and R4.

We are now ready to describe the full operation of this CRL gate. We start with the gate in the RESET state. In the RESET state, the following is true in our example AND/NAND gate:

1) The top rail and all the nodes connected to it are at $V_{ss}$ (e.g., 0 volts).
2) All the sources and drains of the transistors in S1 through S4 and R1 through R4 pass gates are at $V_{ss}$.
3) All the outputs driving N-Channel devices are at $V_{ss}$.
4) The bottom rail and all the nodes connected to it are at $V_{dd}$ (e.g., 5 volts).
5) All the sources and drains of the transistors in S5 through S8 and R5 through R8 pass gates are at $V_{dd}$.
6) All the outputs driving to P-Channel devices are at $V_{dd}$.

We further assume that both the SET and RESET inputs are idle. We now wait until the SET inputs become valid. Note that since the voltage across every pass gate is now zero, turning the SET inputs active from their idle levels creates no dissipative transients. Recall that to go to the SET state, all the SET inputs must be valid and all the RESET inputs must be idle. Thus only the SET pass gates are active during this transition.

To SET the gate, we gradually swing the top rail from $V_{ss}$ to $V_{dd}$ and swing the bottom rail from $V_{dd}$ to $V_{ss}$. Examining the circuit diagram and following the effects of these swings, we see that $F_n$ goes high and $F_p$ low if and only if the input data lines are such that $/(A \wedge B)$ is true. Otherwise, each will remain at its idle level while $/F_n$ swings high and $/F_p$ low. Therefore F, when active, computes $/(A \wedge B)$.

While in the SET state, we must guarantee that every pass gate that was off during the transition remains off for as long as the circuit is in the SET state. This is because a pass gate that was off during the setting h as a potential difference across it. On the other hand, turning off a pass gate that was on during the transition has no adverse effect.

We can pipeline these CRL gates if we do the resetting in the following manner. After setting the circuit, we provide an identical copy of the SET inputs on the RESET lines. We show how to generate these RESET inputs below. At the same time we allow the SET inputs to go idle, i.e., the previous pipeline stage can reset itself so as to accept new data inputs. Since every SET pass gate is paralleled by an identical RESET pass gate, we can now non-dissipatively restore the circuit by gradually restoring the top and bottom rails to their RESET levels. After resetting the circuit, we allow the RESET inputs to go idle. Now, being in the RESET state, the circuit can accept new inputs.

The energy stored in a CRL circuit includes the energy stored in the internal nodes in addition to the energy stored on the output lines. By providing exact duplicates of the set inputs on the rest lines, and by connecting RESET and SET pass gates in parallel everywhere, we guarantee that the energy on these internal nodes is recovered.

Additional transistors T1, T2, T3 and T4 are coupled to the outputs as clamps. Where the voltage on an output line does not swing, it is not positively RESET to the RESET level. The voltage on the line may then wander in the presence of dark currents. To avoid such wandering, T1 and T2 hold the nonswinging line of $F_n$ and $F_p$ at $V_{ss}$, while T3 and T4 anchor the nonswinging line of $/F_n$ and $/F_p$ at $V_{dd}$.

FIG. 17 illustrates how these CRL gates are connected to produce a non-dissipative pipeline. The timing of the four clock lines is shown in FIG. 16. Note that the box with a function $F^{-1}$ performs the inverse operation of the box with a function F. To SET a box, all the SET inputs must be valid and stable and all the RESET inputs must be idle, i.e., they come from a box that is currently in RESET, so that all the RESET pass gates are OFF. With these inputs, swinging the clock rails of the box away from their reset level will SET the box. To RESET the box, the rails are returned to their RESET levels while the SET inputs are idle and the RESET inputs are active and stable.

While this invention has been particularly shown and described with references to preferred embodiments thereof, it will be understood by those skilled in the art that various changes in form and details may be made therein without departing from the spirit and scope of the invention as defined by the appended claims.

In general, the teachings presented in prior application Ser. No. 08/030,625 with respect to the set/reset circuit version of the invention carry through to the split-level version described here. For example, the pipelined adder and multiplier circuits of the prior application can be readily carried over to this split-level version.

What is claimed is:

1. A logic pipeline comprising:
   a forward pipeline of unlatched logic stages, each stage being driven by inputs from a restored state to a set state;
   a reverse pipeline of unlatched logic stages, each stage of the reverse pipeline performing an inverse function of a parallel stage of the forward pipeline and being driven by inputs from a restored state to a set state; and
   interconnections between the forward and reverse pipelines after each stage such that the inputs to each forward stage of the forward pipeline are regenerated through a respective inverse stage in the reverse pipeline and held at the forward stage as the forward stage is returned to a restored state.

2. A logic pipeline as claimed in claim 1 wherein the forward and reverse logic stages are driven by rail voltages and the input to a forward logic stage is regenerated in the reverse logic stage by swinging at least one rail voltage to the reverse logic stage which lags at least one rail voltage of the forward logic stage.

3. A logic pipeline as claimed in claim 1 wherein each forward and reverse logic stage comprises a logic gate and a pass gate, and each logic gate is clocked by rails which split from an intermediate voltage to opposite logic level voltages.

4. A logic pipeline as claimed in claim 3 wherein the pass gates of the forward stages are turned on before the rails of the forward stages are split and the pass gates of the reverse stages are turned on after the rails of the reverse stages are split.

5. A logic pipeline as claimed in claim 4 wherein the outputs of each forward stage are connected in common with outputs of a reverse stage which is the inverse of the next forward stage.

6. A logic pipeline as claimed in claim 1 wherein the outputs of each forward stage are connected in common with outputs of a reverse stage which is the inverse of the next forward stage.

7. A logic pipeline comprising:
   a forward pipeline of unlatched logic stages, each stage comprising a logic gate and a pass gate, each logic gate being driven by inputs from a restored state to a set state as the logic gate is clocked by rails which split from an intermediate voltage to opposite logic level voltages, the pass gates being turned on before the rails are split;
   a reverse pipeline of unlatched logic stages, each stage comprising a logic gate and a pass gate, and each stage performing an inverse function of a parallel stage of the forward pipeline and being driven by inputs from a restored state to a set state as the logic gate is clocked by rails which split from an intermediate voltage to opposite logic level voltages, the pass gate being turned on after the rails are split; and
   interconnections between the forward and reverse pipelines such that the outputs of each forward stage are connected in common with outputs of a reverse stage which is the inverse of the next forward stage and such that the inputs to each forward stage of the forward pipeline are regenerated through a respective inverse stage in the reverse pipeline and held by the inverse stage as the forward stage is returned to a restored state.

8. In a data processing system, a method of processing data comprising:
   in a forward logic stage, performing a logic function on unlatched inputs by swinging at least one rail voltage from a restored level to a set level;
   in a reverse logic stage, receiving outputs of the forward logic stage and regenerating inputs to the forward logic stage with swinging of at least one rail voltage from a restored level to a set level;

applying the regenerated inputs to inputs of the forward logic stage; and swinging the at least one rail voltage of the forward logic circuit from a set level to a restored level.

9. A method as claimed in claim 8 further comprising regenerating the input to the forward logic stage in the reverse logic stage by swinging at least one rail voltage to its reverse logic state which lags the at least one rail voltage of the forward logic stage.

10. A method as claimed in claim 8 wherein each stage comprises logic gates and pass gates, the method comprising clocking each logic gate by rails which split from an intermediate voltage to opposite logic levels.

11. A method as claimed in claim 10 further comprising turning on pass gates of forward stages before the rails are split and turning on pass gates of reverse stages after the rails are split.

12. A method as claimed in claim 11 wherein the regenerated inputs are connected in common with outputs from a forward logic stage.

13. A method as claimed in claim 8 wherein the regenerated inputs are connected in common with outputs from a forward logic stage.

14. A method of processing data in a multistage non-retracking logic pipeline with intermediate stages having unlatched inputs comprising:

to each stage of a forward pipeline and each stage of a reverse pipeline enabling first inputs;

driving outputs of each stage to levels determined by the inputs with a swing of at least one rail voltage;

applying to each stage second inputs which copy the first inputs; and returning the outputs of each stage to restored levels with swing of the at least one rail voltage to a restored level.

15. A method as claimed in claim 14 further comprising applying the outputs of each stage in a forward pipeline to inputs of the next stage of the forward pipeline and to inputs of the stage in the reverse pipeline which regenerates its input, and applying outputs of each stage in the reverse pipeline to inputs of the next stage of the reverse pipeline and to inputs of the respective stage of the forward pipeline.

16. A method as claimed in claim 15 wherein each stage comprises logic gates and pass gates, the method comprising clocking each logic gate by rails which split from an intermediate voltage to opposite logic levels.

17. A method as claimed in claim 16 further comprising turning on pass gates of forward stages before the rails are split and turning on pass gates of reverse stages after the rails are split.

18. A method as claimed in claim 17 wherein the regenerated inputs are connected in common with outputs from a forward logic stage.

19. A method as claimed in claim 15 wherein the regenerated inputs are connected in common with outputs from a forward logic stage.

20. A logic circuit comprising:

a SET group of switches having outputs determined by SET inputs and by at least one rail voltage which swings between SET and RESET levels, the switches performing a logic function of the inputs;

a RESET group of switches which parallel the SET group of switches between the rail voltage and the outputs of the SET group of switches, but which have separate RESET inputs, such that the outputs are driven to SET levels determined by the SET inputs with a swing of the rail voltage to the SET level, the SET inputs then turn off the SET switches, and RESET inputs, which copy the SET inputs, are applied to the RESET group of switches, and the outputs are then returned to the RESET levels by the RESET inputs with swing of the rail voltage to the RESET level.

21. A logic circuit as claimed in claim 20 further comprising pass gates driving the outputs.

22. A logic circuit as claimed in claim 20 wherein the SET group of switches and the RESET group of switches each comprises pass gates, the logic circuit generating as outputs respective pairs of logical complements for driving N-Channel and P-Channel devices, all outputs being RESET to levels which turn the respective devices off.

23. A logic circuit as claimed in claim 20 further comprising clamps on the outputs for driving the outputs to rail voltages.

24. A logic circuit as claimed in claim 20 wherein the RESET group of switches is substantially identical to the SET group in the interconnection of switches and the two groups are interconnected at each node thereof.

25. A logic circuit comprising:

a forward logic stage comprising a SET logic circuit performing a logic function on SET inputs by swinging a rail voltage from a RESET level to a SET level while the SET logic circuit is enabled by the SET inputs and a RESET logic circuit which parallels the SET logic circuit to reset the forward logic stage as the rail voltage swings back to the SET level with the SET logic circuit disabled; and a reverse logic stage receiving outputs of the forward logic stage as its inputs and providing outputs which are copies of the SET inputs to the forward logic stage and which serve as RESET inputs to the forward logic stage as the rail voltage to the forward logic stage swings to a RESET level, the RESET inputs being applied to the RESET logic circuit which parallels the SET logic while the SET logic circuit is disabled.

26. A logic circuit as claimed in claim 25 wherein the reverse logic stage is driven by a swinging rail voltage which lags the swinging rail voltage of the forward logic stage by about one quarter cycle.

27. A logic circuit as claimed in claim 25 wherein the RESET logic circuit is substantially identical to the SET logic circuit in interconnection of switches and the two groups are interconnected at each node thereof.

28. A multistage logic pipeline comprising:

a forward pipeline of stages, each performing a respective logic function; and a reverse pipeline of stages, each performing a respective logic function which regenerates the inputs of a stage of the forward pipeline from the outputs of the stage of the forward pipeline;

each stage of each pipeline comprising:

a SET group of switches having outputs determined by SET inputs and by at least one rail voltage which swings between SET and RESET levels, the switches performing a logic function of the inputs;

a RESET group of switches which parallel the SET group of switches between the rail voltage and the outputs of the SET group of switches, but which have separate RESET inputs, such that the outputs are driven to SET levels determined by the SET inputs with a swing of the rail voltage to the SET level, the SET inputs then turn off the SET switches, and RESET inputs, which copy the SET inputs, are applied to the RESET group of switches, and the outputs are then returned to the RESET levels by the RESET inputs with swing of the rail voltage to the RESET level; and wherein outputs of each stage in the forward pipeline are coupled to the SET inputs of the next succeeding stage of the forward pipeline and to the SET inputs of the stage in the reverse pipeline which regenerates its input, and the outputs of each stage in the reverse pipeline are coupled to RESET inputs of the next succeeding stage of the reverse pipeline and to RESET inputs of the respective stage of the forward pipeline.

29. A multistage logic pipeline as claimed in claim 28 wherein the forward and reverse pipelines are driven by four-phase rails.

30. A multistage logic pipeline as claimed in claim 29 wherein the pipeline has more than four stages in each of the forward and reverse pipelines.

31. A multistage logic pipeline as claimed in claim 28 wherein the succeeding stage of each stage of the forward pipeline is driven in phase with the reverse pipeline stage which regenerates its input.

32. A multistage logic pipeline as claimed in claim 28 wherein the RESET group of switches is substantially identical to the SET group in interconnection of switches and the two groups are interconnected at each node thereof.

33. In a data processing system, a method of processing data comprising:
in a forward logic stage, performing a logic function on SET inputs by swinging a rail voltage from a RESET level to a SET level;
in a reverse logic stage, receiving outputs of the forward logic stage and regenerating inputs to the forward logic stage with swinging of a rail voltage from a RESET level to a SET level;
applying the regenerated inputs to a RESET input of the forward logic stage; and
swinging the rail voltage of the forward logic circuit from a SET level to a RESET level.

34. A method as claimed in claim 33 further comprising regenerating the input to the forward logic stage in the reverse logic stage by swinging a rail voltage which lags the rail voltage of the forward logic stage.

35. A method of processing data in a multistage logic pipeline comprising:
in each stage of a forward pipeline and each stage of a reverse pipeline enabling SET inputs to a SET group of switches;
driving outputs of the stage to SET levels determined by the SET inputs with a swing of rail voltage to a SET level;
disabling the SET inputs;
applying RESET inputs which copy the SET inputs to a RESET group of switches; and
returning the outputs to RESET levels with swing of the rail voltage to a RESET level.

36. A method as claimed in claim 35 further comprising applying the outputs of each stage in a forward pipeline to SET inputs of the next succeeding stage of the forward pipeline and to SET inputs of the stage in the reverse pipeline which regenerates its input and applying outputs of each stage in the reverse pipeline to RESET inputs of the next succeeding stage of the reverse pipeline and to RESET inputs of the respective stage of the forward pipeline.

37. A method as claimed in claim 36 wherein the forward and reverse pipelines are driven by four-phase rails.

38. A method as recited in claim 35 wherein the succeeding stage of each stage of the forward pipeline is driven in phase with the reverse pipeline stage which regenerates its input.

* * * * *